United States Patent [19]

Sakaida et al.

[11] Patent Number: 5,055,872
[45] Date of Patent: Oct. 8, 1991

[54] IMAGE RECORDING APPARATUS HAVING IMAGE MAGNIFICATION CONTROL MEANS

[75] Inventors: Kazuichi Sakaida; Katsuyoshi Sonobe; Nobuo Aoki, all of Nagoya; Satoshi Uchiyama, Kasugai; Makoto Yamada, Gifu, all of Japan

[73] Assignee: Brother Kogyo Kabushiki Kaisha, Aichi, Japan

[21] Appl. No.: 466,752

[22] Filed: Jan. 18, 1990

[30] Foreign Application Priority Data

Jan. 20, 1989 [JP] Japan .................. 1-12150[U]
Jan. 31, 1989 [JP] Japan .................. 1-21770
Feb. 3, 1989 [JP] Japan .................. 1-25993
Feb. 20, 1989 [JP] Japan .................. 1-18716[U]
Feb. 20, 1989 [JP] Japan .................. 1-39962
Feb. 20, 1989 [JP] Japan .................. 1-39963

[51] Int. Cl.$^5$ .................................. G03B 27/52
[52] U.S. Cl. ............................. 355/55; 355/58
[58] Field of Search ............... 355/27, 28, 55, 56, 355/57, 58, 243, 32, 40, 43, 60

[56] References Cited

U.S. PATENT DOCUMENTS 4,421,405 12/1983 Nagahara ................. 355/60 X

Primary Examiner—Brian W. Brown
Assistant Examiner—Khanh Dang
Attorney, Agent, or Firm—Oliff & Berridge

[57] ABSTRACT

An image recording apparatus having a lens unit and a mirror unit. The lens unit and the mirror unit are movably supported by a frame of the apparatus. A cam plate is provided at the lens unit, and a lever is in abutment with the cam plate. When the lens unit is moved in a direction, the cam plate is also moved, so that the lever is pivotally moved. The lever is abutted on the mirror unit. The pivotal motion of the lever, the mirror unit is also moved in another direction. The cam plate has a plurality of cam surfaces each defining respective copying magnifications.

26 Claims, 15 Drawing Sheets

IMAGE RECORDING APPARATUS HAVING IMAGE MAGNIFICATION CONTROL MEANS

BACKGROUND OF THE INVENTION

The present invention relates to an image recording apparatus provided with a mirror unit disposed between a light condensing lens unit and an exposure table for altering a light path, and more particularly, the invention relates to such image recording apparatus capable of controlling an image magnification by displacing the lens unit and the mirror unit.

An image recording apparatus such as a copying machine generally includes a lens unit for condensing lights which contain imaging information from an original and a mirror unit for reflecting lights passed through the lens unit and focussing an image corresponding to the imaging information on an image recording medium. The employment of the mirror unit is advantageous in that light path can be reversely changed by the light reflection at a mirror, to thereby minimize a distance between the original and the image recording medium, yet obtaining a necessary focal length therebetween, to thus render an overall size of the apparatus compact.

In such the image recording apparatus, the lens unit and the mirror unit are disposed movable relative to a frame in order to change imaging magnification. These units are moved to their positions capable of obtaining a desirable output image having a desirable imaging magnification. To attain this, Japanese Utility Model Publication No. 60-39859 corresponding to U.S. Pat. No. 4,421,405 discloses a copying machine in which a lens unit and a mirror unit are provided movable by a single moving means.

More specifically, a lens bracket which mounts lenses thereon is provided movable by the moving means including a motor, a feed screw, and a nut. Further, a mirror bracket which mounts thereon mirrors is also provided movable. The lens bracket and the mirror bracket are provided with cam followers, respectively, and these cam followers are in abutments with a first cam surface and a second cam surface of a cam plate rotatably supported to a frame of the copying machine. Upon movement of the lens bracket, the cam plate is rotated, so that the mirror bracket is moved. The first and the second cam surfaces are arranged in such a manner that the mirror can be subjected to positioning where an image having a desirable magnification is formed on the image recording medium, when the lens is moved to a desirable position for obtaining the magnification. With the conventional structure, the mirror unit is moved in response to the movement of the lens unit. Therefore, it is not necessary to provide two moving means for moving the respective units, but only the single moving means is required for moving both the lens unit and the mirror unit. Accordingly, simple construction results in the conventional copying machine.

However, in order to move the lens unit and the mirror unit by the single moving means, large driving power must be required in the motor. Further, the feed screw and the nut must have high mechanical strength. Consequently, resultant arrangement may have large weight and becomes costly.

SUMMARY OF THE INVENTION

It is therefore, an object of the present invention to overcome the above described drawbacks and to provide an improved image recording apparatus having simple construction and capable of altering an imaging magnification by a minimized driving power.

According to the present invention, there is provided an image recording apparatus including stationary frame, a light source for irradiating light onto an original, the light from the original containing an imaging information corresponding to an image of the original, and an exposure zone on which an image recording medium is disposable for forming an image thereon; the image recording apparatus comprising a lens unit having a lens through which the light from the original passes, the lens unit being movably guided by the stationary frame, a mirror unit for reflecting the light from the lens unit and directing the light toward the image recording medium, the mirror unit being movably guided by the stationary frame a first movable means movable together with one of the lens unit and the mirror unit, the first movable means defining a plurality of copying magnifications, a second movable means movable in response to a movement of the first movable means, the second movable means being abuttable on the first movable means and on remaining one of the mirror unit and the lens unit, and a first moving unit for moving one of the lens unit and the mirror unit in order to provide a copying magnification among the plurality of copying magnifications, the movement of the second movable means responsive to the movement of the first movable means moving the remaining one of the mirror unit and the lens unit to one of positions corresponding to the copying magnification.

In another aspect of the present invention, there is provided an image recording apparatus including a light source, an original supporting means, and an exposure zone on which an image recording medium is exposed to light, an optical path being provided from the light source to the exposure zone, the image recording apparatus comprising a drive source, a lens unit connected to the drive source and linearly movable along the optical path, a linking means pivotally supported and having one end in confrontation with the lens unit and another end, a cam means provided at one of the lens unit and the linking means, a contact means provided at remaining one of the linking means and the lens unit; the contact means being abuttable on the cam means, a mirror unit supported by the another end of the linking means and linearly movable along the optical path in response to the linear movement of the lens unit, and means for preventing pivotal motion of the linking means for preventing the cam means and the contact means from being separated from each other.

Still another aspect of this invention, there is provided an image recording apparatus including a frame and an exposure stand on which an image recording medium is exposed to light, the apparatus comprising a lens unit, a mirror unit movably disposed between the lens unit and the exposure stand, a mirror unit supporting mechanism for changing an controlling a position of the mirror unit; the mirror unit supporting mechanism comprising, a shaft rotatably supported by the frame and extending in a widthwise direction of the mirror unit, a pair of first arm portions spaced away from each other and mounted on the shaft, the first arm portions having base ends and free ends, a first linking member connected between the base ends and extending in the widthwise direction of the mirror unit, a pair of second arm portions spaced away from each other and having free ends and base ends, the free ends of the second arm portions supporting the mirror unit, a second linking member connected between the base ends of the second arm portions, the second linking member being positioned in confrontation with the first linking member, and means for coupling the first and second linking members, the coupling means being provided with position adjusting means for pivotal moving the second linking member relative to the first linking member about a widthwise center axis of the mirror unit, whereby vertical positions of the free ends of the second arm portions can become different from each other.

Still another aspect of this invention, there is provided an image recording apparatus including a light source, an exposure stand, and a mirror unit disposed between the light source and the exposure stand, the light source providing an optical path reaching the exposure stand through the mirror unit, the apparatus comprising the mirror unit comprising first mirror and a second mirror positioned spaced away from the first mirror, the first and the second mirror being confrontingly arrayed to provide a V shape, a light from the light source being first applied to the first mirror and then directed to the second mirror in a second optical path, a mirror holder for holding the first and the second mirror in the V shape array, a holder supporting means which supports the mirror holder, and a mirror position adjusting means provided between the holder supporting means and the mirror holder for moving the mirror holder in a direction parallel with the second optical path.

DETAILED DESCRIPTION OF THE PREFERRED EMBODIMENTS

Figure 1:
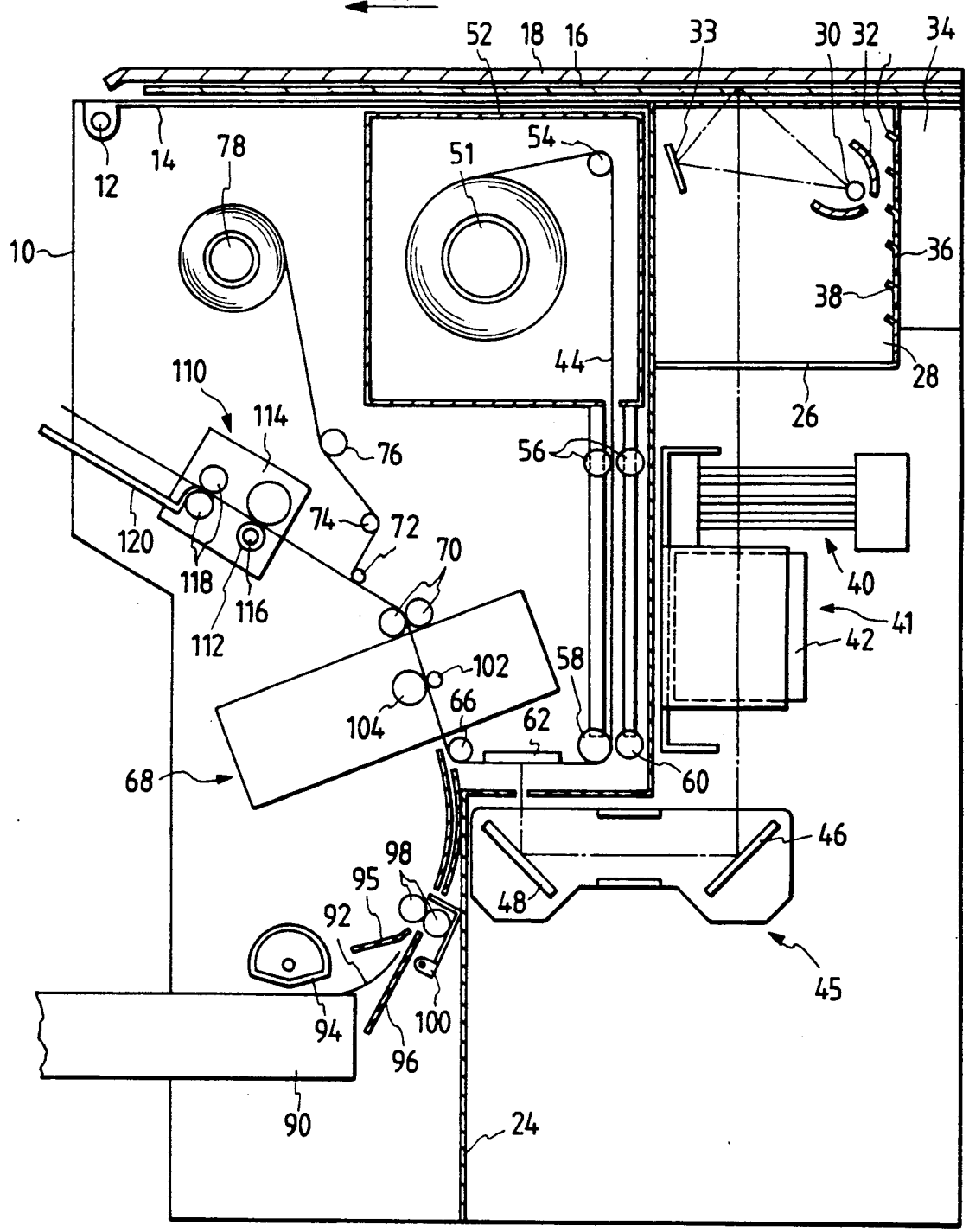
FIG. 1 is a vertical cross-sectional elevation showing one example of an image recording apparatus according to the present invention.

FIG. 1 shows one example of an image recording apparatus which uses a photosensitive pressure sensitive recording medium. The image recording apparatus has a frame defining an internal housing having a box shape. The frame has an upper opening covered with an upper plate 14 pivotally supported by a pivot shaft 12 to the upper end portion of the frame. A glass plate 16 for mounting thereon an original and an original cover plate 18 for covering the glass plate 16 are disposed over the upper plate 14. The glass plate 16 and the cover plate 18 are movable in horizontal direction for moving the original mounted on the glass plate 16 in a direction indicated by an arrow A during exposure operation.

Within the internal space of the housing, a partitioning wall 24 extends in a vertical direction. The partitioning wall 24 divides the internal space into an optical section and another section such as an exposure zone and a pressure developing unit so as to prevent lights in the optical section from leaking into the another section except for the exposure zone. In an upper portion of the optical section, another partitioning plate 26 is provided. A combination of the first and the second partitioning walls 24 and 26 define a light irradiation chamber 28 whose upper and lower ends are opened. Within the light irradiation chamber 28, a light source such as a halogen lamp 30 is provided.

The halogen lamp 30 is of an elongated shape extending in a direction perpendicular to the traveling direction of the original and in widthwise direction thereof. A pair of upper and lower reflection mirrors 32 and 32 are provided adjacent the halogen lamp 30 so as to direct light from the lamp 30 toward the glass plate 16. Further, a reflector 33 is provided in confronting relation with the halogen lamp 30 within the light irradiation chamber 28. The reflector 33 is adapted to reflectingly direct lights toward the original, those lights being not initially directed toward the original from the lamp 30. Furthermore, a cooling fan 34 is provided at an external surface of the second partitioning wall 26 and a louver 36 is provided on the second partitioning wall 26 for introducing an external air into the light irradiation chamber 28 through the louver 36.

Below the light irradiation chamber 28, a filter unit 40 and a lens unit 41 are provided. The filter unit 40 is adapted for changing light transmissive characteristic in accordance with a photosensitivity of a photosensitive pressure sensitive sheet 44 serving as an image recording medium in order to control a color tone of an output image. The lens unit 41 includes a lens 42 into which the light reflected from the original is entered through the filter unit 40.

The light condensed by the lens 42 is focussed on the photosensitive pressure sensitive sheet 44 by way of a mirror unit 45 disposed below the lens unit 41. The mirror unit 45 includes a first mirror 46 and a second mirror 48. The light passing through the lens 42 is subjected to directional 48, the latter being positioned immediately below the exposure zone for exposing the photosensitive pressure sensitive sheet 44 at the exposure zone to the light. In the above described embodiment, the optical components such as the halogen lamp 30, the filter unit 40, the lens unit 41 and the mirror unit 45 constitute an exposure means, and these optical components are positioned within the above described optical section.

The lens unit 41 and the mirror unit 45 are vertically movable so as to change image magnification by a plurality of stages. Details of the lens unit 41 and the mirror unit 45 will be described later.

The photosensitive pressure sensitive sheet 44 includes a plurality of microcapsules coated on a base, each microcapsules encapsulating therein a photosensitive resin which is photo-curable upon light exposure, a chromogenic material and a polymerization initiator. The photosensitive pressure sensitive sheet 44 is of an elongated shape and is rolled over a supply shaft 51. The rolled photosensitive pressure sensitive sheet 44 is positioned in a casing 52. The casing 52 is disassembleable from the frame 10 when moving the casing 52 in one direction parallel to the direction A. A guide roller 54 is disposed within the casing 52 so as to direct the photosensitive pressure sensitive sheet 44 downwardly. Further, a pair of feed rollers 56 are positioned immediately below the casing 52 for feeding the sheet 44 downwardly. Furthermore, a barrel roller 58 and a nip roller 60 are disposed below the feed rollers 56,56 for feeding the sheet 44 in horizontal direction. An exposure table 62 is disposed above a horizontal portion of the partitioning wall 24 and immediately above the second mirror 48 so as to provide the above-described exposure zone. The photosensitive sheet 44 moving in the horizontal direction is traveled along and immediately below the exposure table 62.

A guide roller 66 is provided at downstream of the exposure stand 62 for guiding the light-exposed photosensitive pressure sensitive sheet 44 toward a pressure developing unit 68. Further, a pair of feed rollers 70, a separation roller 72 a guide roller 74 and a meandering travel controlling roller 76 are provided so as to direct the photosensitive pressure sensitive sheet 44 toward a takeup shaft 78. The feed speed of the feed rollers 70 is equal to the moving speed of the glass plate 16. Therefore, a linear line latent image is successively formed line by line on the photosensitive pressure sensitive sheet 44 at the exposure stand 62 in synchronism with the movement of the glass plate 16. Further, the feed rollers 56 and 70 is connected to a drive motor (not shown) for feeding the sheet 44, and the takeup shaft 78 is connected to a second drive motor (not shown), and these motors are operated in synchronism with each other so as to equalize the feeding speed of the photosensitive sheet 44 to the takeup speed thereof.

Below the pressure developing unit 68, a developer sheet cassette 90 is provided for storing therein a stack of developer sheets 92. The developer sheet 92 includes a base and a developer material coated thereover, which developer material can provide a chromogenic reaction with the chromogenic material in the microcapsules of the photosensitive sheet 44. A sector roller 94 is provided immediately above the developer sheet cassette 90 for delivering an uppermost developer sheet toward the pressure developing unit 68. Further, a pair of guide plates 95,96 are provided for guide travel of the developer sheet 92, and feed rollers 98, 98 are provided for feeding the developer sheet 92 to the pressure developing unit 68. The developer sheet 92 and the light-exposed photosensitive pressure sensitive sheet 44 are superposed with each other at an inlet portion of the pressure developing unit 68 for undergoing pressure developing operation.

The above feed rollers 98 includes three pairs of rollers juxtaposedly arranged in transverse direction of the developer sheet 92. A central pair of the feed rollers 98 are in continuous contact with the developer sheet 92 and allow the developer sheet 92 to slippingly pass therethrough, whereas the other two pairs of feed rollers 98 are normally spaced away from the developer sheet 92, and are brought into contact with the developer sheet 92 at the time of the sheet feeding without any slippage with respect to the sheet 92. A resist gate 100 is provided at a position downstream these feed rollers 98 so as to control the feed timing of the developer sheet 92. That is, the resist gate 100 is adapted to align a leading edge of the developer sheet 92 with a leading end portion of the light-exposed portion of the photosensitive pressure sensitive sheet 44 at the inlet portion of the pressure developing unit 68. The resist gate 100 is normally positioned to prevent the developer sheet 92 from being delivered toward the pressure developing unit 68. The developer sheet 92 delivered from the sheet cassette 90 by the sector roller 94 is brought into abutment with the resist gate 100 by the central pairs of the feed rollers 98. The developer sheet 92 is thus subjected to positional alignment by aligning the leading edge thereof with the resist gate 100. Thereafter, the resist gate 100 is moved to its retracted position so that the leading edge of the developer sheet 92 will be brought into alignment with the leading end of the light exposed portion of the photosensitive sheet 44. Incidentally, the sector roller 94 and the feed rollers 98 etc. are driven by a developer sheet feeding motor (not shown).

The pressure developing unit 68 includes a small diameter pressure roller 102 and a large diameter pressure roller 104. A rotation axis of the large diameter roller 104 is stationarily positioned whereas the small diameter roll 102 is provided movable toward and away from the large diameter roller 104. The movement of the small diameter roller 102 is given by a drive motor. During non service state of the pressure developing unit 68, the small diameter roller 102 is moved away from the large diameter roller 104, whereas during the pressure developing operation, the small diameter roller 102 is moved toward the large diameter roller 102 to apply pressure to the superposed photosensitive pressure sensitive sheet 44 and the developer sheet 92. Incidentally, the small diameter roller 102 is driven by the motor which is adapted to feed the photosensitive sheet 44. When the small diameter roller 102 is moved toward the large diameter roller 104, these pressure rollers 102 and 104 are rotatable at a peripheral speed for feeding the superposed sheets equal to the feed speed given by the feed rollers 56 and 70.

A thermal fixing unit or heating unit 110 is provided at downstream of the pressure developing unit 68. The heating unit 110 includes a heat roller 112 and a back-up roller 114. The heat roller 112 is of a hollow cylindrical shape, and a heater 116 is positioned in the hollow space. The heat roller 112 is adapted to heat the developer sheet 92 which has been subjected to the pressure developing operation. Further, a pair of feed rollers 118 is disposed in the heating unit for feeding the thus heated developer sheet 92, and discharging the latter outside the heating unit. A discharge tray 120 is provided for receiving the developer sheet 92. The feed rollers 118 are driven by the photosensitive sheet feed motor described above.

Next, the lens unit 41 and the mirror unit 45 according to a first embodiment of this invention will be described with reference to FIGS. 2 thru 9, and, the lens unit 41 will first be described with reference to FIGS. 2 and 3.

Figure 2:
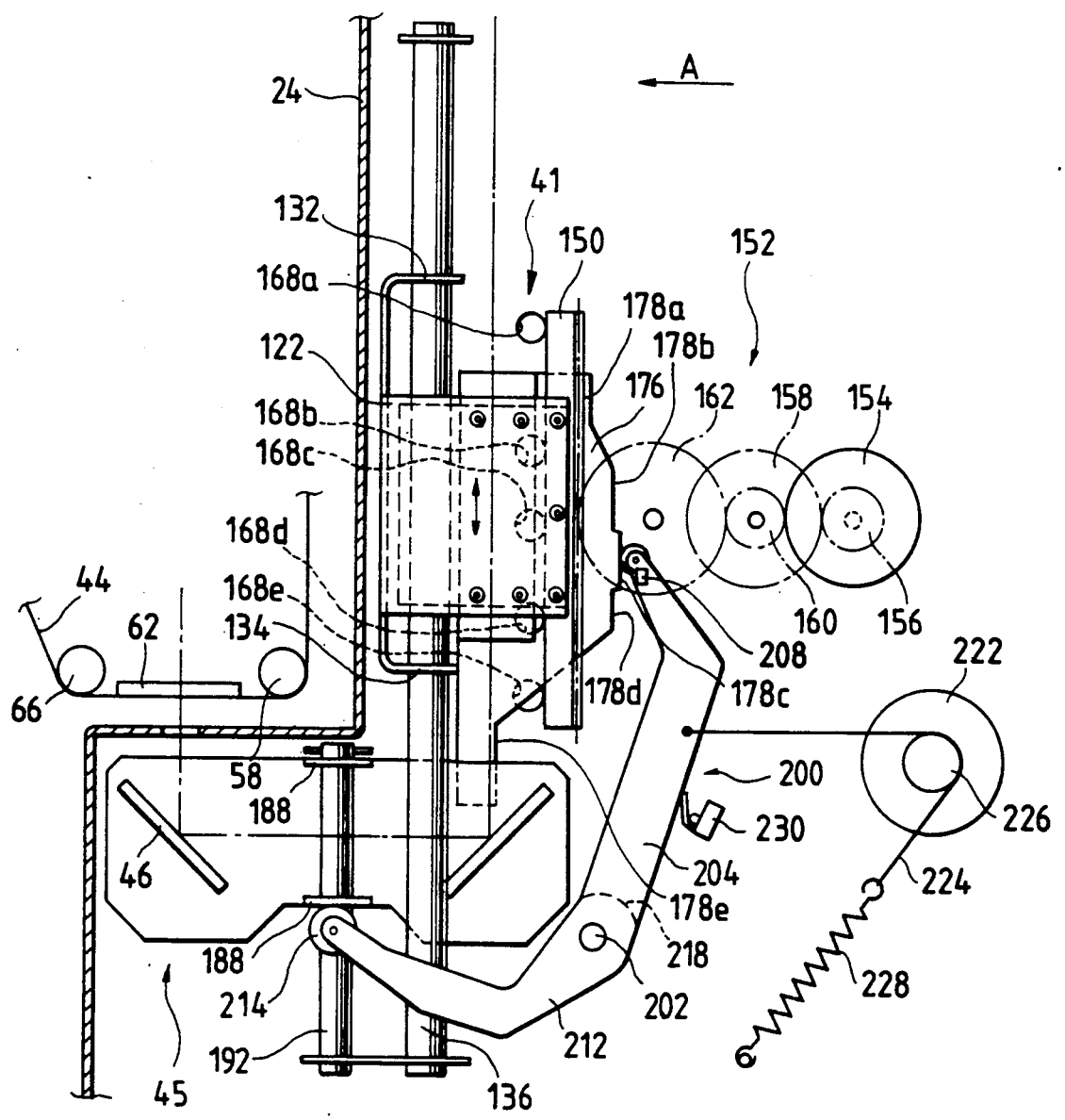
FIG. 2 is a fragmental side view for particularly showing a lens unit and a mirror unit assembled in the image recording apparatus according to a first embodiment of the present invention.
Figure 3:
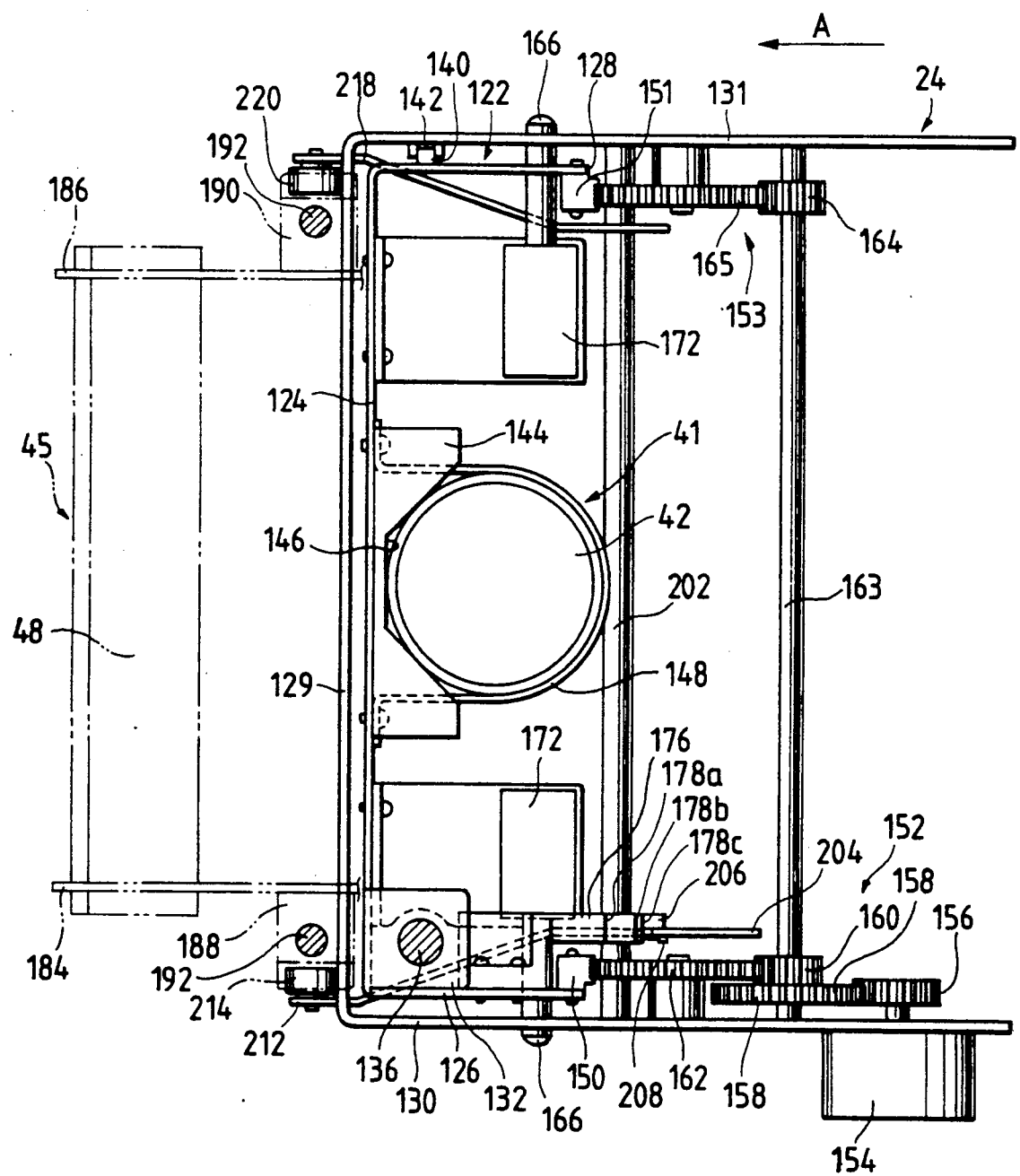
FIG. 3 is a plan view particularly showing the lens unit according to the first embodiment of this invention.

As shown in FIGS. 2 and 3, the lens unit 41 includes a lens bracket 122 movable in a vertical direction. The lens bracket 122 has a U-shape cross-section as best shown in FIG. 3. Further, the above described partitioning wall 24 also has a U-shape cross-section as best shown in FIG. 3. That is, the lens bracket 122 includes a front wall 124, a first side wall 126 and a second side wall 128, which walls extend in parallel with a front wall 129, a first side wall 130 and a second side wall 131 of the partitioning wall 24, respectively. As shown in FIG. 2, upper and lower guide plates 132 and 134 horizontally extend from the front wall 124 and at positions adjacent the first side wall 126 of the lens bracket 122. Further, a guide rod 136 extends in vertical direction at a position adjacent the partitioning wall 24. These guide plates 132 and 134 are disposed slidable with respect to the guide rod 136.

A rail 140 is provided at an outer surface of the second side wall 128 and extends in vertical direction. Further, a guide groove 142 is provided at an inner surface of the second side wall 131 of the lens bracket 122 in confronting relation with the rail 140. The rail 140 is engageable with the guide groove 142. Therefore, the lens bracket 122 is disposed slidable in vertical direction without any rotary motion.

A pair of positioning blocks 144 (only a single block 144 is shown in FIG. 3) are provided at an inner surface of the front wall 124 of the lens bracket 122. The positioning blocks 144 are spaced away from each other in the vertical direction. Each of the positioning blocks 144 is formed with a V-shaped groove 146 for positioning a lens block 42. That is, the lens block 42 is positioned within the V-shaped groove 146 and is secured to the front wall 124 by a band 148.

Distal ends of the first and second side walls 126 and 128 of the lens bracket 122 are provided with racks 150, 151, respectively, as best shown in FIG. 3. These racks 150,151 extend in vertical direction, and are driven, through first and second gear trains 152, 153, by a stepper motor 154 mounted on the first side wall 130 of the partitioning wall 24. The first gear train 152 includes a pinion 156 coupled to an output shaft of the stepper motor 154, a level gear 158 meshedly engageable with the pinion 156, a small gear 160 provided integral with the level gear 158 and an idle gear 162 meshedly engageable with the small gear 160 and the rack 150. The level gear 158 and the small gear 160 are mounted on a shaft 163 rotatably supported by and extending between the first and second side walls 130 and 131 of the partitioning wall 24. The second gear train 153 includes a small gear 164 mounted on the shaft 163, and an idle gear 165 meshedly engaged with the small gear 164 and the second rack 151. The rotation of the stepper motor 154 is transmitted to the racks 150, 151 by way of the gear trains 152, 153 with a decelerated speed, so that the racks 150 and 151 are vertically moved for moving the lens unit 41 in vertical direction. The rotation amount of the stepper motor 154 is stepwisely controlled (for example five steps) to move the lens unit 41 to its each position where a desirable image magnification is obtained. The first and the second racks 150, 151, the first and the second gear trains 152,153 and the stepper motor 154 will constitute a first moving unit.

A pair of pins 166 are slidably fitted into the first and second side walls 126 and 128 of the lens bracket 122, and extend in horizontal direction. Further, five fitting holes 168a,168b,168c,168d and 168e are formed at each of the side walls 130 and 131 of the partitioning wall 24. These fitting holes are spacedly arranged on a vertical line, which spaces are provided for obtaining five stage image magnifications. Each of the pins 166 is selectively fittable with one of the fitting holes 168a thru 168e. Further, each of the pins 166 is connected to each of plungers of each of solenoids 172 fixedly mounted to the front wall 124 of the lens bracket 122. The pins 166 are urged by coil springs (not shown) to fit with one of the fitting holes when the solenoids 172 are deenergized. On the other hand, when the solenoids 172 are energized, these pins 166 are disengaged from the fitting holes against the biasing force of the coil springs, to thereby allow the lens unit 41 to be moved in the vertical direction.

A positioning plate or a cam plate 176 serving as a first movable means is fixedly secured to an inner surface of the first side wall 126 of the lens bracket 122. A distal end surface of the positioning plate 176 is formed with first through fifth positioning surfaces or cam surfaces 178a,178b,178c,178d and 178e, those being arrayed in vertical direction. The vertical space between the neighboring positioning surfaces corresponds to the vertical stepwise moving positions (five positions) of the lens unit 42 (space between the neighboring fitting holes 168a–168e). Each of the positioning surfaces has protruding amount different from one another (the protruding direction being in parallel with the moving direction of the original). This difference in the protruding amounts will be described in detail later.

Next the mirror unit 45 according to the first embodiment will be described with reference to FIGS. 2 and 3. The mirror unit 45 includes a first mirror 46 and a second mirror 48 each extending in widthwise direction of the original. Both ends of each of the mirrors are supported by first and second supporting plates 184 and 186. Further, a pair of guide plates 188 and 188 extend horizontally from outer surfaces of the supporting plate 184. Vertical positions between the horizontal guide plates 188 and 188 is different from each other. The same is true with respect to another pair of guide plates 190 and 190 extending horizontally from an outer surface of the other supporting plate 186. Further, a pair of guide rods 192 extend in vertical direction and are attached to the partitioning wall 24. Each of the guide plates 188 and 190 is slidingly movable relative to each of the guide rods 192. Therefore, the first and second supporting plates 184, 186 of the mirror unit 45 is movable in the vertical direction along the guide rods 192.

Figure 4:
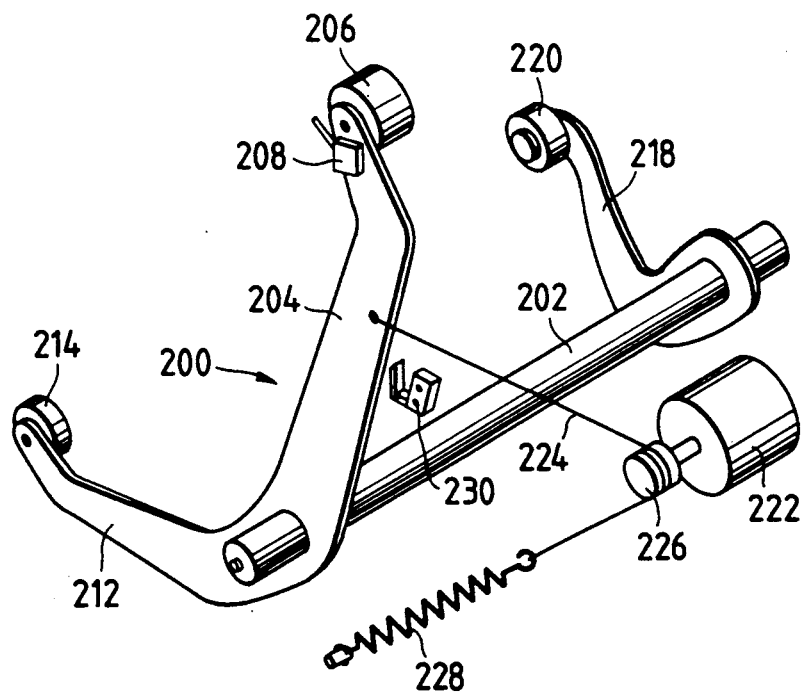
FIG. 4 is a perspective fragmental view showing a second movable means and a second moving unit according to the first embodiment of this invention.

Next, mechanical relationship between the lens unit 42 and the mirror unit 45 according to the first embodiment of this invention will be described with reference to FIGS. 2 thru 5. As best shown in FIGS. 2 and 4, a main lever 200 is pivotably provided at a position adjacent the lens unit 41 and the mirror unit 45. The main lever 200 is mounted on a shaft 202 extending in a widthwise direction of the original and rotatably supported by the partitioning wall 24. The main lever 200 is pivotable about an axis of the shaft 202. The main lever 200 has generally L shaped configuration, and its intermediate portion is coupled to an end portion of the shaft 202 as best shown in FIG. 4.

Figure 5:
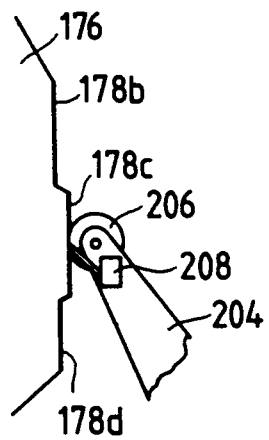
FIG. 5 is a partial schematic illustration showing abutting state between a first movable means and the second movable means.

The main lever 200 has a first arm portion 204 and a second arm portion 212. The first arm portion 204 has a free end positionable in confronting relation with the positioning plate 176 of the lens unit 42. When the first arm 204 is pivotally positioned above the shaft 202, and when the lens unit 41 has its elevated position, the free end of the first arm 204 can be successively confronted with each one of the first thru fifth positioning surfaces 178a thru 178e. As shown in FIGS. 4 and 5, one side of the free end is rotatably provided with a roller 206 abuttable on one of the positioning surfaces and rotatable about an axis directed in parallel with the axis of the shaft 202. Another side of the free end of the first arm 204 is provided with a limit switch 208 which detects abutment of the abutment roller 206 with one of the positioning surfaces 178a-178e. Further, a free end portion of the second arm portion 212 is positioned at a space adjacent the lower guide plate 188 of the mirror unit 45, and the free end portion of the second arm portion 212 is rotatably provided with a first depression roller 214.

The shaft 202 has another end portion integrally provided with a subordinate lever 218 having a configuration and dimension the same as those of the second arm portion 212 of the main lever 200. Further, the subordinate lever 218 is in exact confrontation with the second arm portion 212. A free end of the subordinate lever 218 is positioned at a space adjacent the lower guide plate 190, and is rotatably provided with a second depression roller 220 provided coaxial with the first depression roller 214.

The first and the second supporting plates 184 and 186 which support the first and the second mirrors 46 and 48 are urged downwardly by urging means (not shown). Therefore, the first and the second depression rollers 214 and 220 are always in contact with the lower surfaces of the lower guide plates 188 and 190, respectively. Accordingly, the main lever 200, the subordinate lever 218 and the mirror unit 45 have associating relationship with one another. The main lever 200 and the subordinate lever 218 will constitute second movable means. In this associating relationship, the first arm portion 204 of the main lever 200 is positioned above the shaft 202, whereas the second arm portion 212 of the main lever 200 and the subordinate lever 218 are positioned aside from the shaft 202.

As shown in FIGS. 2 and 4, the main lever 200 is connected to a drive motor 222. More specifically, one end of a cord or a braid 224 is secured to the first arm portion 204 of the main lever 200, which wire 224 is wound over a sleeve 226 fixedly secured to an output shaft of the drive motor 222. The cord 224 has another end secured to the partitioning wall 24 through a tensile spring 228. The biasing force of the tensile spring 228 is slightly smaller than a force combined by a weight of the mirror unit 45 and a downwardly urging force given by the urging means (not shown) which urges the first and the second supporting plates 184,186 downwardly.

When the drive motor 222 is rotated in one direction (counterclockwise direction in FIG. 4), the cord 224 is released or taken out of the sleeve 226. Therefore, the first arm portion 204 of the main lever 200 is pivotally moved in the counterclockwise direction. That is, the weight of the lens unit 45 and the downward urging force can be moved downwardly because of the cord slacking and depress the depression rollers 214 and 220 downwardly. These downward force is greater than the biasing force of the tensile spring 228 as described above. As a result, the second arm portion 212 and the subordinate arm 218 are also pivoted in the counterclockwise direction in FIG. 4 to rotate the shaft 202 and thus to move the first arm portion 204 in the counterclockwise direction.

Because of the pivotal motion of the first arm portion 204 in counterclockwise direction, the roller 206 rotatably supported at the free end of the first arm portion 204 is brought into abutment with one of the positioning surfaces 178a-178e provided at the first movable means, i.e., the positioning plate 176 secured to the bracket 122.

On the other hand, when the drive motor 222 is rotated in an opposite direction (clockwise direction in FIGS. 2 and 4), the cord 224 is wound over the sleeve 226 and pulls the first arm portion 204 in the clockwise direction against the weight of the lens unit 45 and the urging force provided by the urging means. Therefore, the roller 206 is moved away from the one of the positioning surfaces 178a-178e. Incidentally, a limit switch 230 is stationarily provided at a moving locus of the first arm portion 204 so as to detect the departure of the main lever 200 from the positioning plate 176. The drive motor 222 and the cord 224 will constitute a second moving unit.

When the main lever 200 is pivotally moved, the position of the abutting roller 206 positioned above the shaft 202 is changed in horizontal direction (traveling direction A of the original), but is almost unchanged in a vertical direction. On the other hand, the positions of the depressing rollers 214 and 220 positioned aside the shaft 202 are almost unchanged in the horizontal direction, but are changed in the vertical direction. Therefore, if the horizontal position of the abutting roller 206 is changed, the vertical position of the mirror unit 45 can be changed. In this connection, the positions of the positioning surfaces 178a–178e, i.e, five horizontally protruding amounts of these positioning surfaces, are determined so that the mirror unit 45 can have an optimum vertical position to obtain the latent image having desirable magnification among five kinds on the photosensitive pressure sensitive sheet 44 positioned at the exposure stand 62.

With the structure, image recording operation is carried out by exposing the photosensitive pressure sensitive sheet 44 to light so as to form the latent image thereon corresponding to the original image, pressure developing the photosensitive sheet 44 and the developer sheet 92 at the pressure developing unit 68, and thermally fixing the output image on the developer sheet 92 at the heating unit 110. In case of altering the imaging magnification, firstly the drive motor 222 is energized so as to pivotally move the main lever 200 in the clockwise direction in FIG. 2 for moving the abutting roller 206 away from the one of the positioning surfaces 178a–178e. In this case, the tensile coil spring 228 also pulls the main lever 200 in the clockwise direction because of its biasing force, to thereby assist the drive motor 222. In other words, the tensile coil spring 228 will supplement driving force of the drive motor 222. When the departure of the abutting roller 206 from the one of the positioning surfaces is detected by the limit switch 230, the drive motor 222 is deenergized.

As a result of the separation of the abutting roller 206 from the positioning surface, the lens unit 41 can become movable independent of the mirror unit 45. Further, the pins 166 are disengaged from the one of the fitting holes 168a–168e, so that the lens bracket 122 is freely movable in vertical direction. Thereafter, the stepper motor 154 is energized so as to move the lens unit 41 by way of the first and second gear trains 152,153 and the racks 150,151 to the desirable vertical position. Then, the pins 166 are brought into fitting engagement with one of the fitting holes 168a–168e to thus fixedly position the lens unit 41 at the desired vertical position.

In accordance with the vertical movement of the lens unit 41, one of the positioning surfaces 178a–178e is brought into confrontation with the abutting roller 206. After the positional fixing of the lens unit 41, the drive motor 222 is energized to pivotally move the main lever 200 in counterclockwise direction in FIG. 2, the abutting roller 206 is brought into abutment with the confronting one of the positioning surfaces 178a–178e which is indicative of the desired image magnification. Upon detection of the abutment of the abutting roller 206 with one of the positioning surface by the limit switch 208, the drive motor 222 is deenergized, and in response to this abutment, the mirror unit 45 is subjected to positioning in the vertical direction because of the abutment between the guide plates 188, 190 with the depression rollers 214,220, whereby the mirror unit 45 is also positioned at the given position where the image having the desirable magnification is focussed on the photosensitive pressure sensitive sheet 44.

Figure 6:
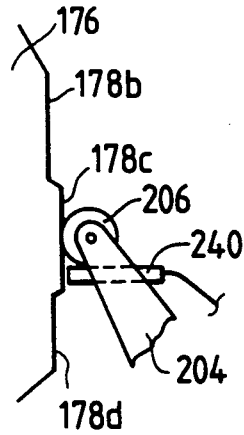
FIG. 6 is a partial schematic illustration showing abutting state between a first movable means or a cam plate and the second movable means or the mirrorunit supporting means according to one modification effected to the first embodiment.

In the above described embodiment, various modifications can be made. For example, in the above described embodiment, the abutment of the abutting roller 206 with the one of the positioning surfaces 178a–178e is detected by the limit switch 208. However, as shown in FIG. 6, a proximal switch 240 can be provided at the first arm portion 204 of the main lever 200.

Figure 7:
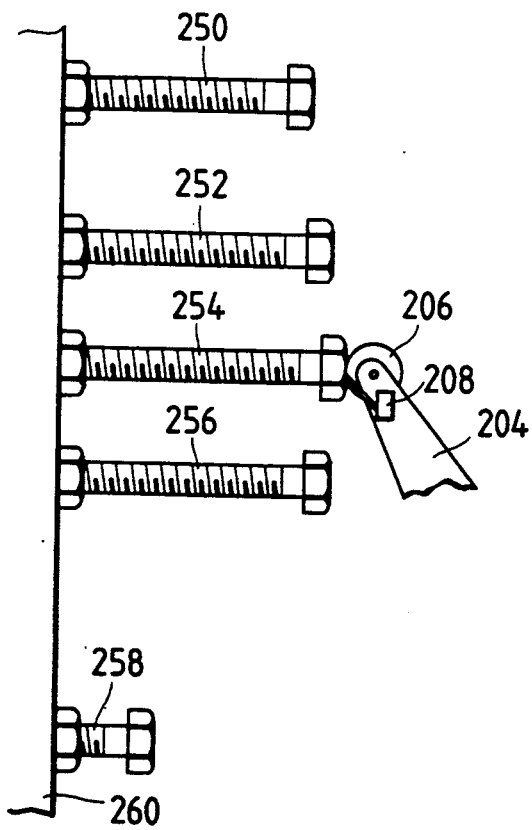
FIG. 7 is a partial schematic illustration showing abutting state between a first movable means and the second movable means according to another modification effected to the first embodiment.

Further, in the above embodiment, the plurality of positioning surfaces 178a–178e are formed at the distal end faces of the single positioning plate 178. However, a plurality of positioning members can be used to independently provide the positioning surfaces. For example, as shown in FIG. 7, a plurality of bolts 250,252,254 and 256 are implanted on a rigid plate 260 fixedly secured to the lens bracket 122, and each of the bolt heads can serve as the respective positioning surfaces. With this construction, positions of the positioning surfaces can be changed by controlling threading amounts of each of the bolts relative to the rigid plate 260.

Furthermore, in the above described embodiment, the drive motor 222 is energized when the abutting roller 206 is moved toward one of the positioning surfaces. However, as a modification, urging means is connected to the main lever 200 so as to urge the same in this direction. and when the drive motor 222 is deenergized, the main lever 200 is moved toward the positioning surface by the urging means. In this case, however, means for moderating moving speed of the main lever may be required for avoiding impacting abutment of the abutting roller against the positioning surface.

Further, more, in the above described embodiment, the lens unit 41 is moved by the first moving unit (racks 150,151, the gear trains 152,153 and the stepper motor 154) when altering the imaging magnification. However, as a modification, the mirror unit 45 can be moved for this purpose by the first moving unit.

Further, more, in the above described embodiment, the first movable means (positioning plate 176) has a plurality of positioning surfaces. However, as a modification, the second movable means (the main lever 200 and the subordinate lever 218) can have the plurality of positioning surfaces. For example, one end of the linking means constituted by the main and the sub-levers can be provided with the positioning surfaces or cam surfaces and the lens unit is provided with a contact means such as a roller in rolling contact with the cam surfaces. Alternatively, both the first and the second movable means can have a plurality of the positioning surfaces or cam surfaces. Moreover, the abutting portions between the first and the second movable means are provided by the plane surface and the roller in the above described embodiment. However, various abutting or contacting manners may be conceivable such as projection v.s. a recess, or plane v.s. plane.

Figure 8:
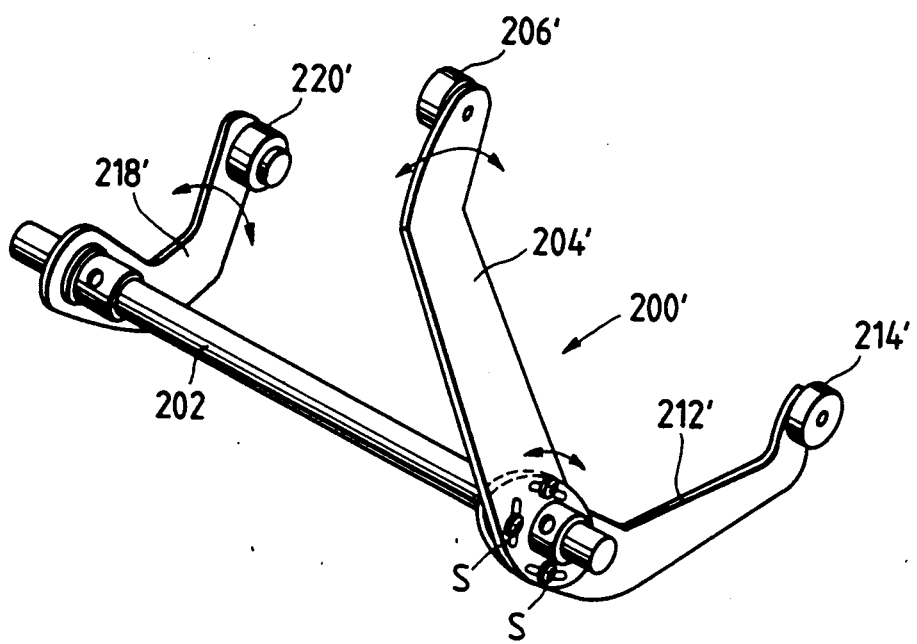
FIG. 8 is a perspective fragmental view showing a second movable means according to one modification effected to the second movable means shown in FIG. 3.
Figure 9:
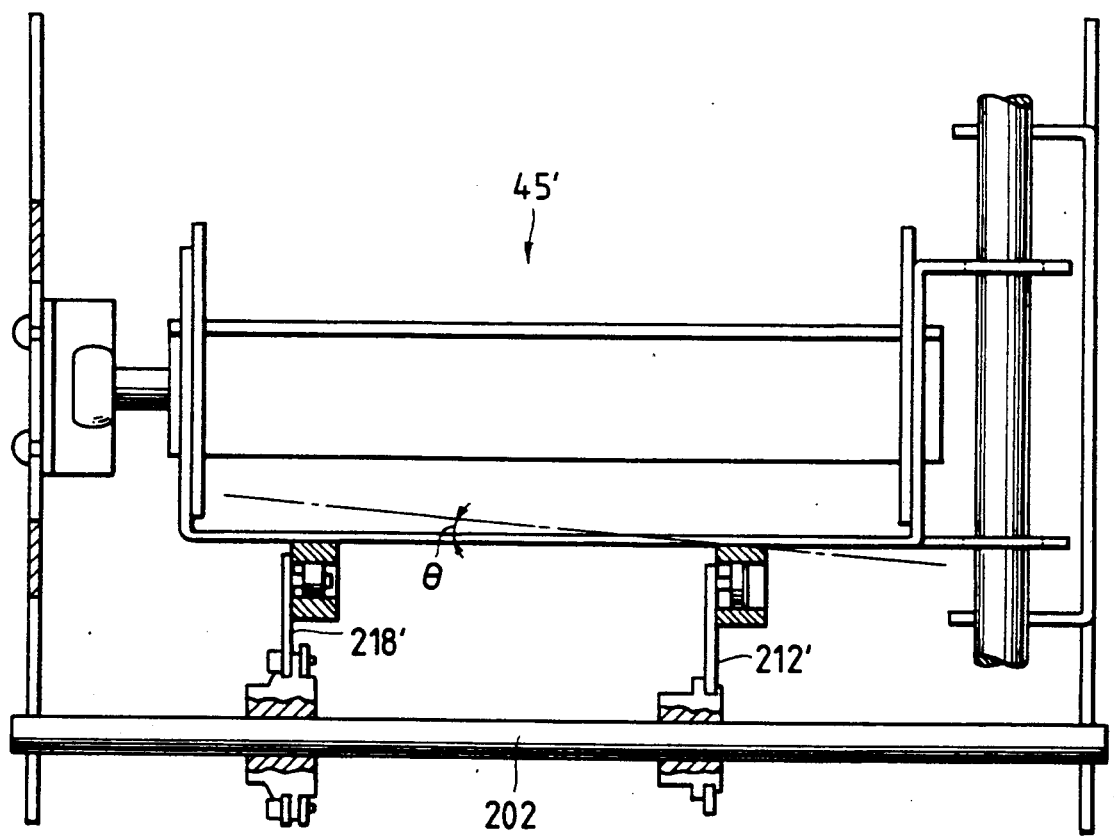
FIG. 9 is a plan view showing a mirror unit and the modified second movable means.

Further, more, as shown in FIGS. 8 and 9, a main lever 200' can be provided movable relative to the shaft 202. In the above described embodiment, the main lever 200 and the subordinate lever 218 are provided integral with the shaft 202 and these levers are positioned at exact confrontation with each other. However, in the modified embodiment, angular orientation of the main lever 200' can be changed relative to the shaft 202 or to the subordinate lever 218'. That is, a plurality of screws S are clampably engaged with slots of the main lever 200' so as to change angular orientation thereof. With this structure, vertical positions between the depression rollers 214' and 220' are different from each other, so that the inclination degree of the mirror unit 45' can be controlled. Upon completion of the inclination, these second movable means 200' and the 218' are operated in the manner the same as that of the above-described embodiment to change vertical position of the mirror unit 45'.

Further, more, the above described first movable means can be provided at the mirror unit side, whereas the second movable means has one end abutable on the first movable member and another end abuttable on the lens unit.

The above described embodiment or its modifications can be available for the image recording apparatus other than that employing the photosensitive pressure sensitive recording medium, such as an electrophotographic copying machine.

A lens and mirror units according to a second embodiment of this invention will be described with reference to FIGS. 10 thru 12, wherein like parts and components are designated by the same reference numerals and characters as those shown in the first embodiment. In the second embodiment, there is provided means for preventing the main lever 200 from being vibrated during transportation of the image recording apparatus. For this, a lever stop means 210 is further provided in the second embodiment.

Figure 10:
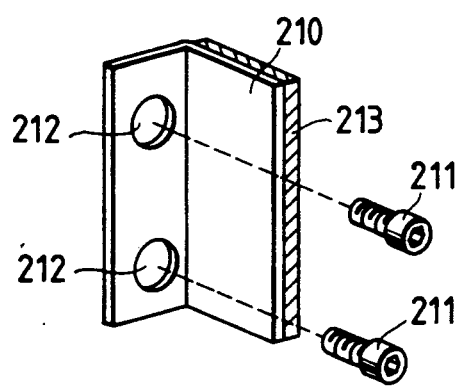
FIG. 10 is a fragmental perspective view showing a lever stop member for preventing the second movable means from being vibrated according to a second embodiment of this invention.

The lever stop member 210 is best shown in FIG. 10, which has L-shape. The lever stop member 210 is attached to the partitioning wall 24 by means of screws 211 which extend through oblong shaped bores 212 formed in the stop means 210. As shown in FIG. 11, the lever stop member 210 is attached at a position which prevents an abutting roller 206 from being separated or moved in a clockwise direction from the most highest positioning surface (such as 178c) of a positioning plate 178. The attaching position of the lever stop member 210 is adjustable by slightly moving the latter within the range of the oblong shaped bores 212. In other words, the screws 211 have diameters approximately equal to the minor axis of the oblong bores 212 but smaller than a major axis thereof. Further, a sponge 213 is attached to the lever stop member 210 which sponge 213 is in direct abutment with the arm portion 204 of the main lever 200.

Figure 11:
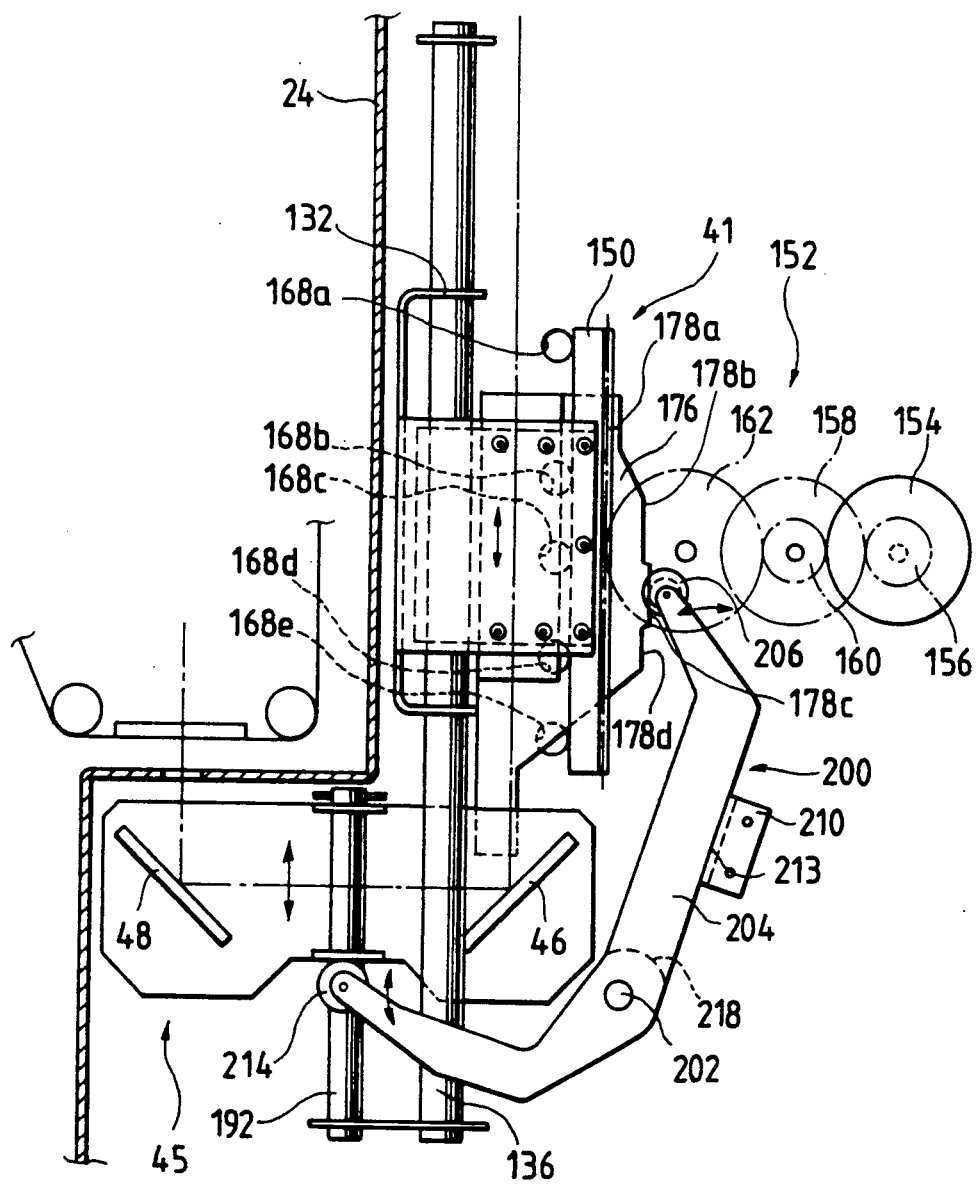
FIG. 11 is a side view showing for particularly showing a lens unit and a mirror unit assembled in the image recording apparatus according to the second embodiment of the present invention.

FIG. 11 shows the abutting roller 206 in abutment with the one (highest) positioning surface 178c of the positioning plate 176. In this state, the pins 166 are protruded by solenoids 172, so that these pins 166 are fitted with one fitting holes 168c formed in the partitioning wall 24. Therefore, the lens unit 41 is fixedly secured to one vertical position. One of the positioning surfaces 178c will provide an image having the size the same as that of the original image (Xl magnification). In this state, the first arm portion 204 of the main lever 200 is in abutment with the lever stop member 210. Therefore, in the state shown in FIG. 11, the pivotal movement of the lever 200 is prevented. Further, in this state, the mirror unit 45 is also in abutment with the depression rollers 214 and 220, so that the position of the mirror unit 45 is also fixed. On the other hand, when the abutting roller 206 is in abutment with one positioning surface other than the positioning surface 178c, the main lever 200 is slightly rotatable in the clockwise direction. That is a space is provided between the first arm portion 204 and the lever stop member 210.

As described above in the second embodiment of this invention, the pivotal movement in the clockwise direction (FIG. 11) is avoided by providing the lever stop member 210. Therefore, the abutting roller 206 is not moved away from the highest positioning surface 178c which provides the image magnification equal to the original image, and simultaneous, the mirror unit 45 is also secured by the depression rollers. Accordingly, any vibration of the mirror unit can be avoided during transportation of the image recording apparatus, to thus protect the mirror unit 45 against any impacting force.

A third embodiment according to the present invention will next be described with reference to FIGS. 13 thru 15. The third embodiment pertains to an improvement on the modified example shown in FIGS. 8 and 9 as described in the first embodiment.

Figure 13:
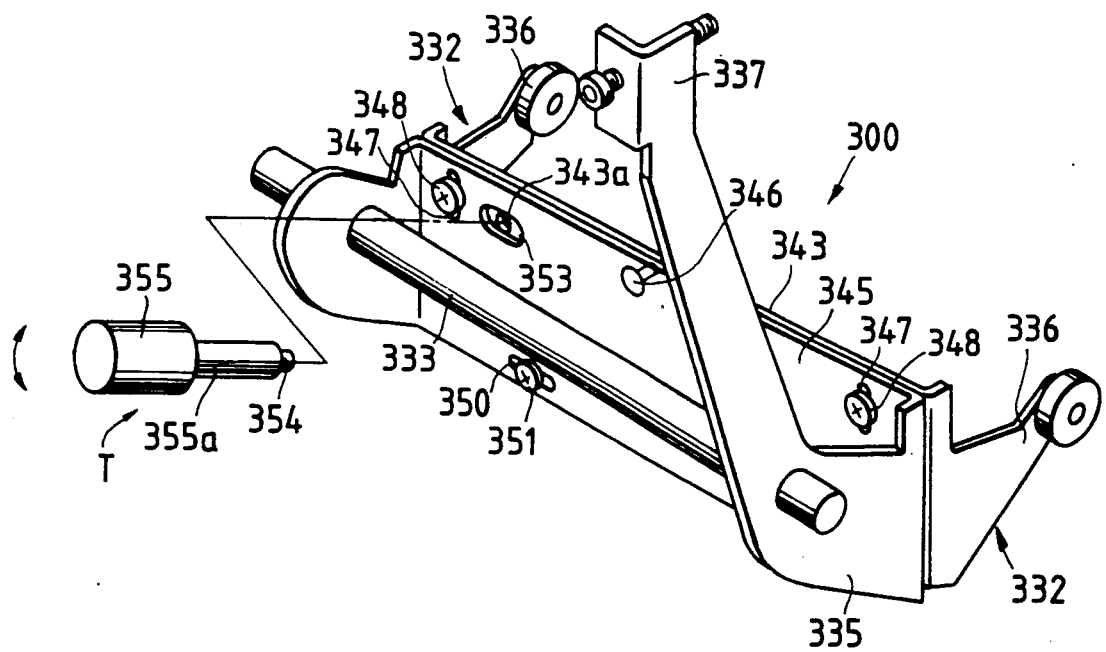
FIG. 13 is a perspective view showing a mirror unit supporting mechanism or a second movable means according to a third embodiment of this invention.
Figure 14:
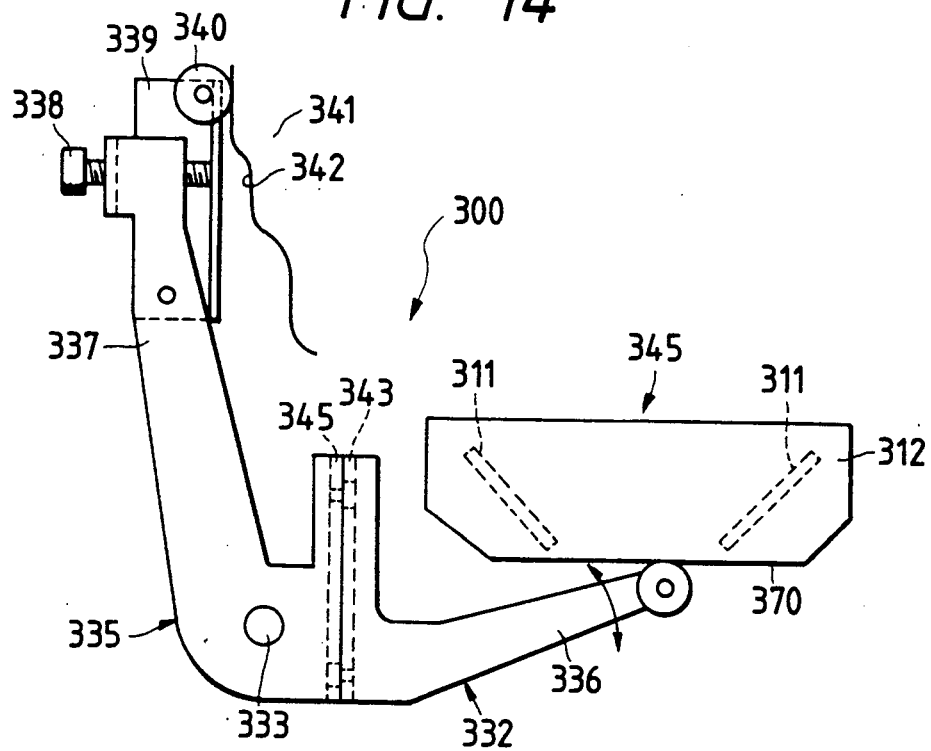
FIG. 14 is a schematic illustration particularly showing the positional relationship between the mirror unit and the second movable means or the mirror unit supporting mechanism according to the third embodiment.

As shown in FIGS. 13 and 14, pair of lever members 300 are spacedly provided on a shaft 333 extending between stationary frames F, F of the main frame 10 for supporting the mirror unit 345. Each of the lever members 300 includes a supporting portion 332 which supports a bottom plate of the mirror unit 345, and an arm portion 335 coupled to the supporting portion 332 and mounted on the shaft 333. Each of the supporting portions 332 includes a second arm portion 336, so that the mirror unit 331 is supported by two points, i.e., free end portions of the second arm portions 336. On the other hand, the arm portion 335 includes a pivotal arm portion 337 for pivotally moving the lever member 300 about an axis of the shaft 333. A roller supporting plate 339 is threadingly engaged with a bolt 338 provided at an upper free end portion of the pivotal arm portion 337, and a roller 340 is rotatably supported on the roller supporting plate 339. The roller 340 is adapted for rolling contact with each of the positioning surfaces 342 of the positioning plate 341.

A first flat linking member 343 is connected between each base ends of the supporting portions 332. Further, a second flat linking member 346 is connected between each base ends of the arm portions 335. These first and second linking members 343 and 345 are in facial contact with each other, and the first linking member 343 is provided movable relative to the second flat linking member 345 and is pivotable about a center line 346 extending in a widthwise center of the mirror unit 345.

More specifically, the second linking member 345 is formed with a pair of elongated slots 347,347 extending in vertical direction and positioned adjacent the end portions thereof. Further, a pair of thread holes are formed in the first linking member 343 at positions corresponding to the elongated slots 347,347. Further, a pair of screws 348,348 extend through the elongated slots 347,347 and threadingly engaged with the pair of thread holes, so that the first and the second linking members 343 and 345 are coupled together. In this case, inclination of the first linking member 343 relative to the second linking member 345 is controllable by moving the first linking member 343 along the elongated slots 347,347.

Further, At a lower portion of the second linking member 345, a horizontally elongated slot 350 is formed, and a vertical slot (not shown) is formed at corresponding portion of the first linking member 343. A screw 351 extends through the horizontally elongated slot 350 and and the vertically extending slot. Therefore, a position of the first linking member 343 relative to the second linking member 345 is adjustable.

At an upper end portion of the second linking member 345, an elongated slot 353 is formed and a hole 343a is formed at a corresponding position of the first linking member 343. An adjustment jig T is provided which includes an eccentric shaft portion 354, an intermediate center shaft portion 355a and a knob portion 355. The eccentric shaft 354 is insertable into the hole 343a. whereas a center shaft 355a is insertable into the elongated slot 353. Upon rotation of the knob 355, relative vertical position and inclination between the first and second linking members 343 and 345 are controllable.

In the third embodiment, in order to adjust the vertical position of the mirror unit 345, the positioning plate 341 (cam plate) is moved to pivotally move the pivotal arm portions 337, to thereby move the supporting arm portions 336 in vertical direction. In this case, the vertical movement of the mirror unit 331 is guided by first and second guide means 356,357 provided at distal end portions thereof. These guide members 356 and 357 are connected to attachment plate 312 which is adapted to attach a reflection mirror 311. More specifically, as shown in FIG. 15, the first guide means 356 includes a guide rod 371 and supporting plates 372 extending from the attachment plate 312 and loosely fitted with the guide roll 371. On the other hand, the second guide means 357 includes a holding frame 375 disposed slidable in an elongated slot 373 formed in the frame F, and a connection rod 373 extending from the attachment plate 312 and is pivotally supported by the holding frame 375. Therefore, inclination of the mirror unit 345 can be changed.

Figure 15:
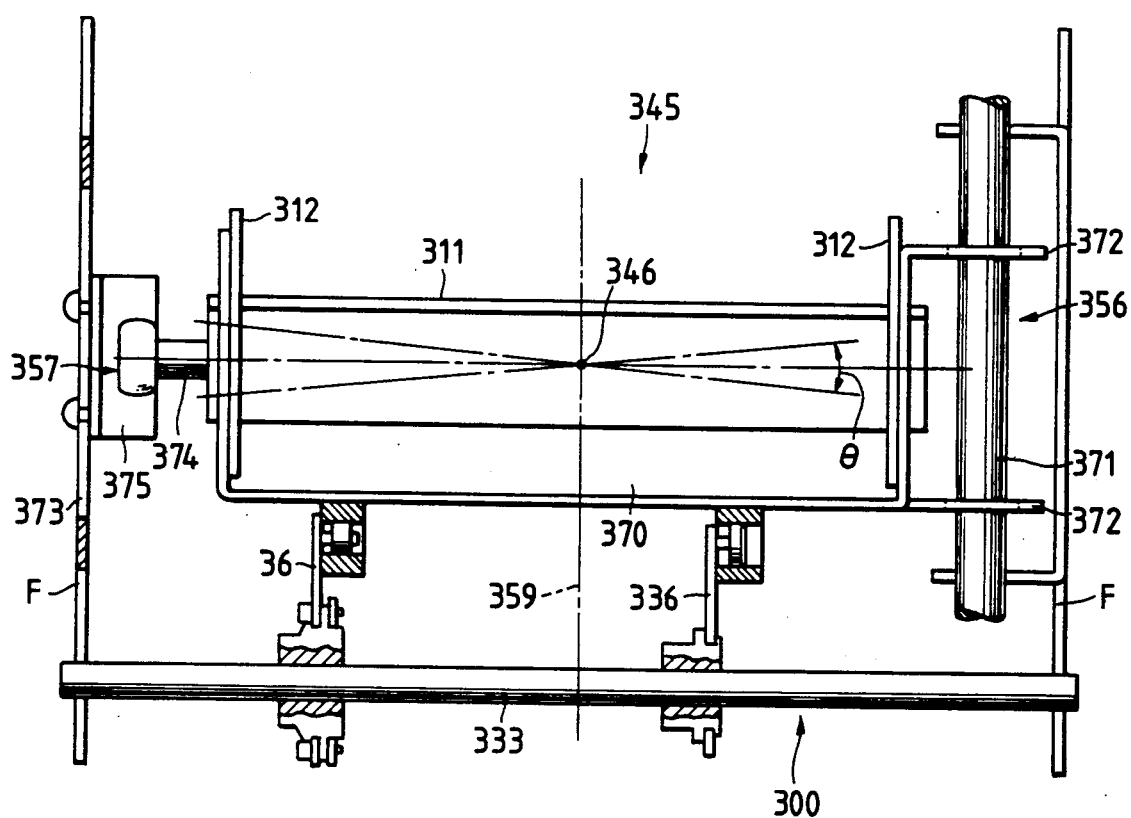
FIG. 15 is a rear view showing the mirror unit supporting mechanism according to the third embodiment.

In order t change the inclination of the mirror unit 345, firstly, the screws 348 are unfastened, and as shown in FIG. 15, the first linking member 343 is moved so as to move the side end portions of the mirror 311 vertically about the rotational center axis 346. In the third embodiment, since the first linking member 343 is movable about the center axis 346 relative to the second linking member 345 so as to change inclination angle of the reflection mirror 311, the position of the center axis 346 is maintained unchanged. Therefore, if an optical axis of the condensing lens of the lens unit 41 (first embodiment) is positioned coincident with the center axis 346, it is unnecessary to readjust the optical axis position in accordance with the every adjustment of the inclination of the mirror unit 345. In this connection, such readjustment may be required in the embodiment shown in FIGS. 8 and 9.

In the third embodiment described above, the second linking member 345 associated with the arm portions 335 is coupled to the first linking member 343 associated with the supporting arm portions 332 which supports the mirror unit 345. And these linking members and lever members are positioned at positions adjacent the widthwise center of the mirror unit 345 as shown in FIG. 15, and further, the first linking member 343 is provided pivotable with respect to the second linking member 345 about the center axis 346. Therefore, when adjusting the inclination of the lens unit, it is unnecessary to also adjust vertical position thereof. In other words, vertical position of the lens unit is merely determined by the abutment between the roller 340 and the positioning surface, and the thus determined vertical position of the mirror is not influenced by the adjustment of the inclination to the mirror.

Figure 16:
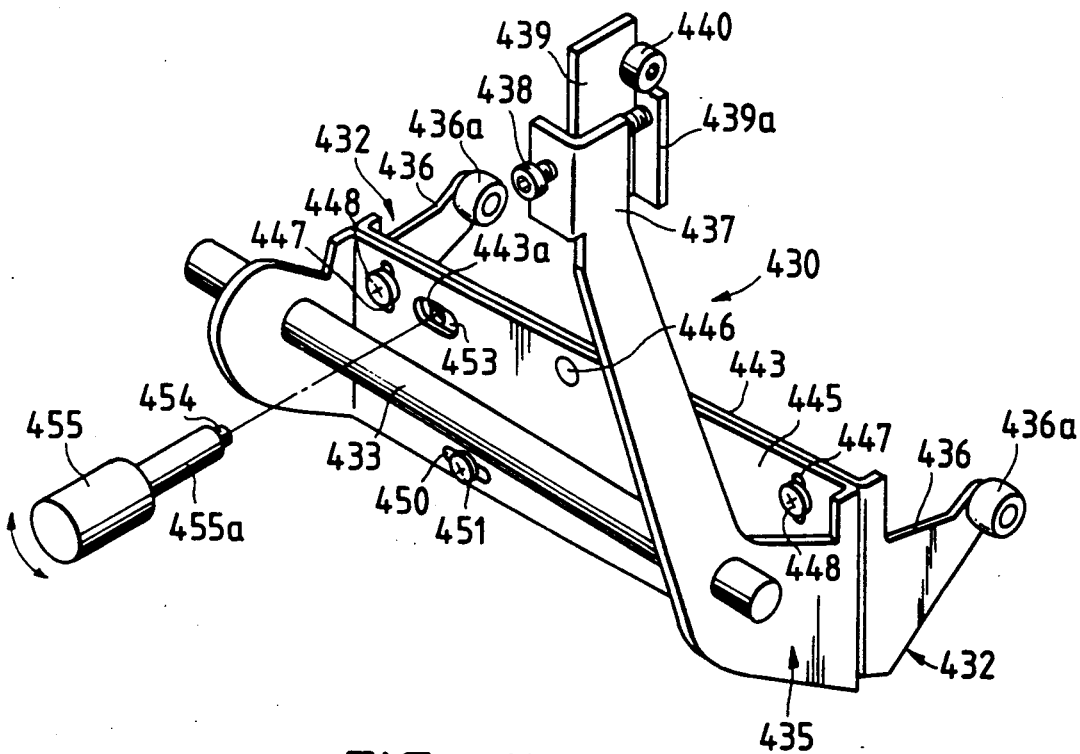
FIG. 16 is a perspective view showing a mirror unit supporting mechanism according to a fourth embodiment of this invention.
Figure 17:
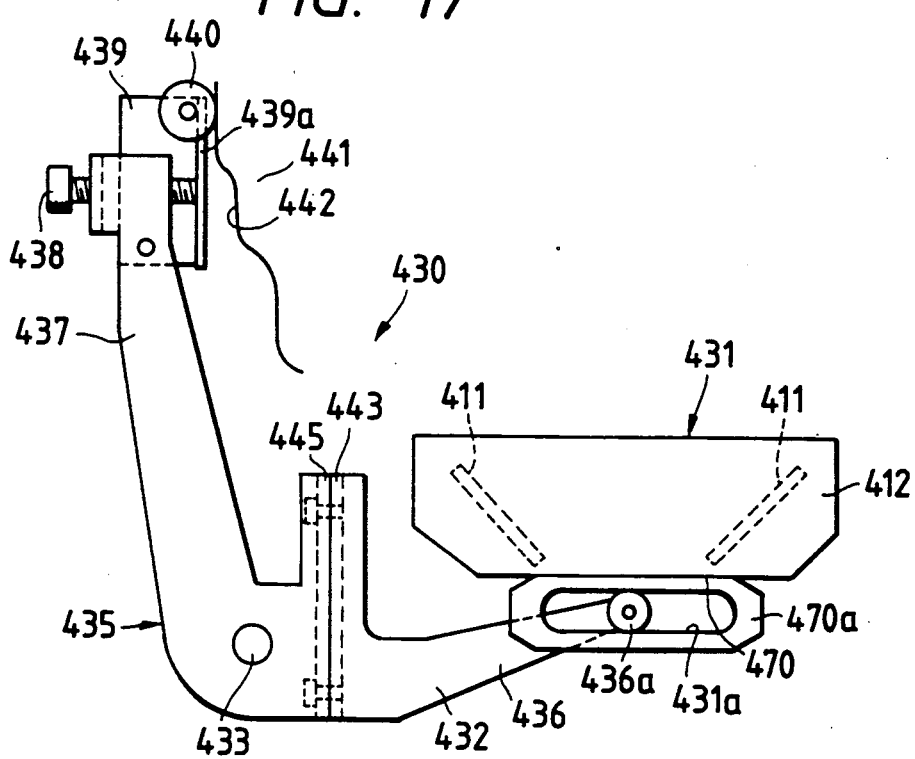
FIG. 17 is a side view showing the mirror unit supporting mechanism according to the fourth embodiment.
Figure 18:
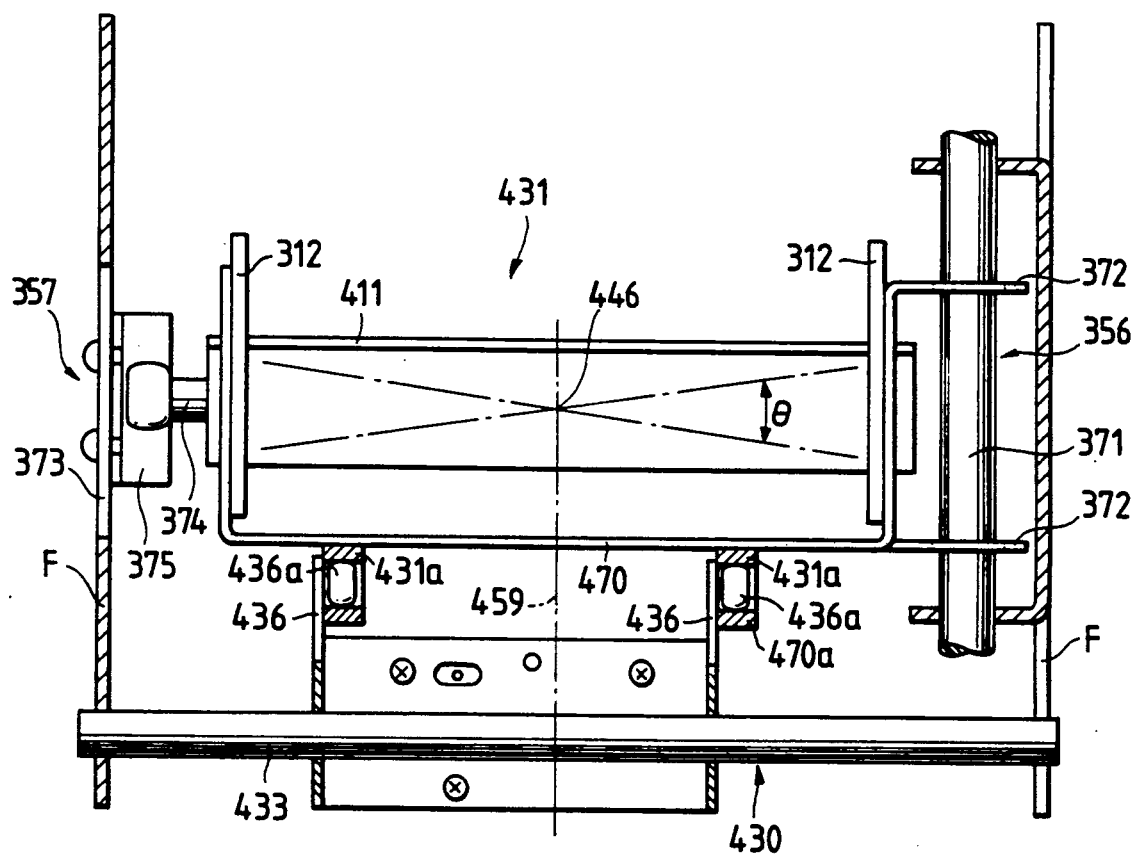
FIG. 18 is a rear view showing the mirror supporting mechanism according to the fourth embodiment.

A fourth embodiment according to the invention will be described with reference to FIGS. 16 thru 18. This embodiment concerns an improvement on the third embodiment in order to more smoothly and accurately obtain inclination of the mirror unit. A bottom plate 470 of a mirror unit 431 is supported by a mirror supporting mechanism 430. The supporting mechanism 430 includes a pair of supporting portions 432, 432 and a pair of arm portions 435,435 each coupled to the supporting portions 432 432 and rotatably supported by frames F, F of the image recording apparatus by means of a shaft 433 extending between the frames F, and F. Each of the supporting portions 432,432 includes an supporting arm 436, 436 whose tip end is rotatably provided with a barrel roller 436a having an arcuate peripheral surface in cross-section. Therefore, the bottom plate 470 is supported by the pair of barrel rollers 436a which are in point contact therewith because of this arcuate outer peripheral surface.

The bottom plate 470 of the mirror unit 431 is provided with a pair of brackets 470a extending downwardly, and a horizontal slot 431a is formed in the bracket 470a. The barrel rollers 436a are in rolling contact with the slots 431a of the brackets 470a, and are movable in the horizontal direction along the slots 431a.

The arm portions 435,435 are provided with pivot arms 437,437 and are mounted on the shaft 433. Each of upper ends of the pivot arms 437,437 is fixedly provided with a roller supporting plate 439 by means of bolts, and a roller 440 is rotatably supported by the roller supporting plate 439. Each of the rollers 440 is in rolling contact with one of the positioning surfaces 442 of a positioning plate 441 (cam plate).

A flat linking member 443 is provided so as to link together the supporting arms 436 and 436, and a second flat linking member 445 is provided so as to link together the arm portions 435 and 435. Inclination of the fist linking member 443 relative to the second linking member 445 can be changed. This inclination is obtained by slightly rotating the first linking member 443 relative to the second linking member 445 about a lateral center 446 which is defined in a widthwise direction of the mirror unit 431.

At both ends of the second linking member 445, vertical slots 447,447 are formed, and screw holes (not shown) are formed in the first linking member 443 at corresponding portions. These linking members 443 and 445 are coupled together by screws 448,448 extending therethrough. By unfastening these screws and by slightly rotating the first linking member 443 about the center axis 446, the inclination of the first linking member 443 can be changed.

At a lower edge portion of the second linking member 445, a horizontally extending slot 450 is formed, and the first linking member 443 is formed with a vertically extending slot (not shown) at a position confronting the slot 450. A screw 451 extends through these slots. Further, at an upper edge portion of the second linking member 445, a horizontal slot 453 is formed, whereas a cylindrical hole 443a is formed in the first linking member 443 at a position in alignment with the slot 453. An adjustment jig 455 is provided which has an eccentric shaft 454 engageable with the cylindrical hole 443, and a cylindrical portion 455a engageable with the slot 453. Upon rotation of the adjustment jig 455 about its axis with maintaining these fitting engagements, the second linking member 443 is slightly rotatable about the center axis 446.

As described in the foregoing embodiments, the vertical position of the mirror unit 431 can be changed by moving the positioning plate or the cam plate 441 in the vertical direction so as to pivotally move the arm portions 435 about an axis of the shaft 433. By this pivotal movements, the supporting arms 436 436 can be moved in vertical direction. In this vertical movements of the supporting arms 436 436, there is no batting vibration of the supporting arms 436,436 with respect to the mirror unit 431 during change in copying magnification and during copying operation, since the barrel rollers 436a 436a are in fitting engagements with the slots 431a. In other words, the mirror unit supporting mechanism is always in contact with the mirror unit 431.

Further, when changing inclination of the first linking member 443, the orientations of the supporting portions 432 432 and orientations of the barrel rollers 436a 436a are also changed. However, such change in orientation does not affect fitting engagement between the barrel rollers 436 and the slots 470a, since the barrel rollers are in point contact therewith. In other words, the arcuate surfaces of the barrel rollers can be moved during adjustment of the inclination, so that the barrel roller can always provide point contact with the slot 431a at any points or the roller surface. Stated differently, by the inclination control of the first linking member 443, the vertical positions between the barrel rollers 436a and 436a are different from each other so as to obtain inclination of the mirror unit 431. In this case, the inclination of the mirror unit 431 is exactly in conformance with the inclination of the first linking member 443 because of the arrangement between the barrel rollers 436a and the slots 431a. Similar to the third embodiment, both ends of the mirror unit 431 are guided by guiding means 356 and 357. These guide means are the same as those described in the third embodiment, and therefore, further description can be negligible.

As described above, in the fourth embodiment, the rollers 436a 436a which support the mirror unit 431 are always in contact therewith. Therefore, inadvertent vibration of the mirror unit can be obviated, and clear image can be provided at any one of the copying magnifications.

Figure 19:
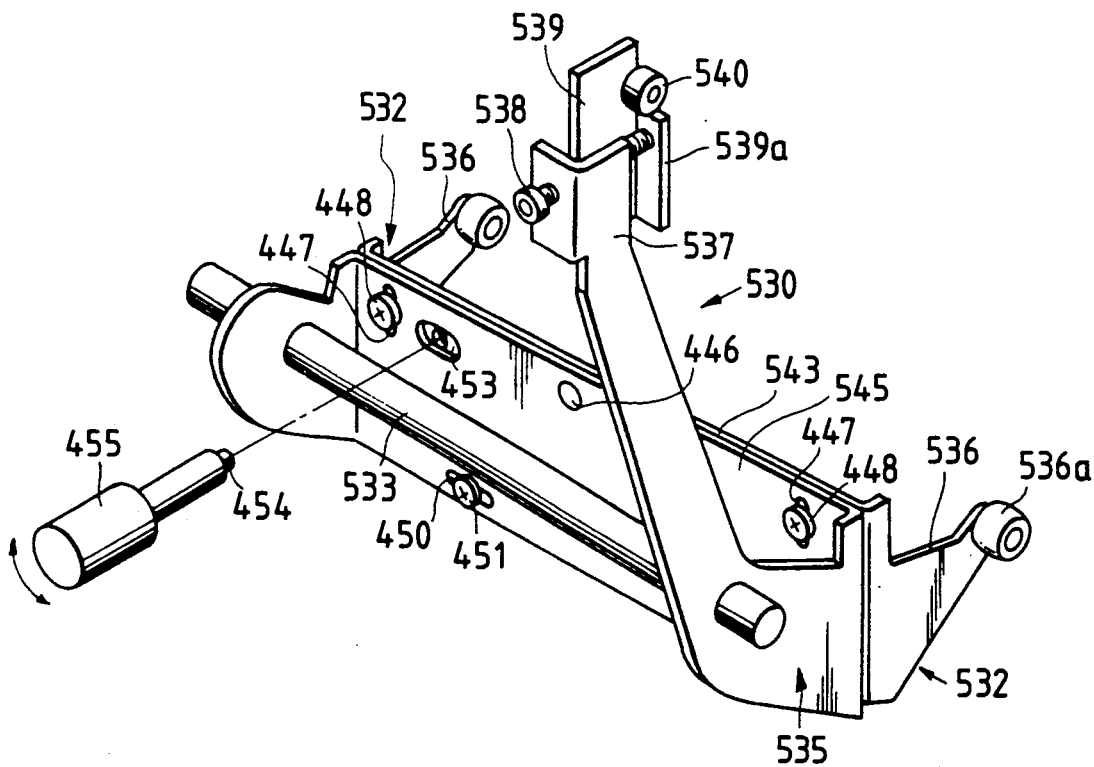
FIG. 19 is a perspective view showing a mirror unit supporting mechanism according to a fifth embodiment of this invention.
Figure 20:
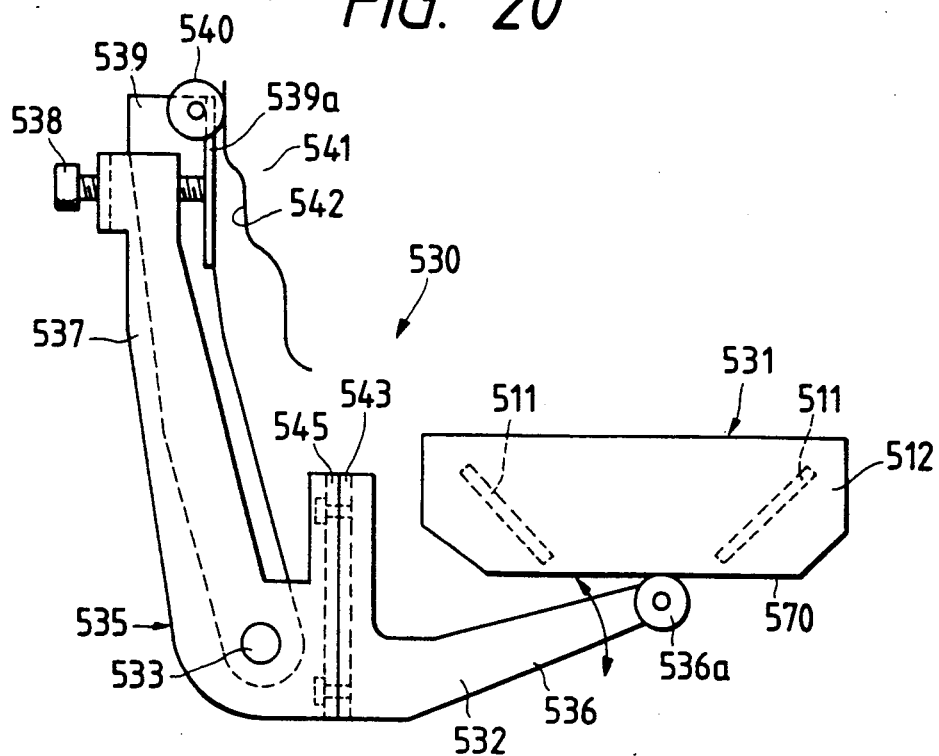
FIG. 20 is a side view of the mirror unit supporting mechanism shown in FIG. 19.

A fifth embodiment according to this invention will next be described with reference to FIGS. 19 and 20. The fifth embodiment concerns fine control to the vertical position of the mirror unit. Similar to the third and fourth embodiments, first and second linking members 543 and 545 are provided. A bottom plate 570 of a mirror unit 531 is supported by a mirror supporting mechanism 530. The supporting mechanism 530 includes a pair of supporting portions 532, 532 and a pair of arm portions 535,535 each coupled to the supporting portions 532 532 and rotatably supported by frames F, F of the image recording apparatus by means of a shaft 533 extending between the frames F, and F. Each of the supporting portions 532,532 includes an supporting arm 536, 536 whose tip end is rotatably provided with a barrel roller 536a having an arcuate peripheral surface in cross-section. Therefore, the bottom plate 570 is supported by the pair of barrel rollers 436a which are in point contact therewith because of this arcuate outer peripheral surface.

The arm portions 535,535 are provided with pivot arms 537,537 and are mounted on the shaft 533. Each of upper ends of the pivot arms 537,537 is provided with an adjustment bolt 538 threadingly movable toward and away from a positioning plate 541.

According to the fifth embodiment, a control arm 539 is pivotally provided about the shaft 533. The control arm 539 is directed almost in parallel with the pivot arm 537, and the control arm 539 is not fixedly coupled to the shaft 533, but is rotatable thereabout. A free end of the control arm 539 is fixedly provided with a bent portion 539a to which an end face of the adjustment bolt 538 is abutted. Further, a roller 540 is rotatably supported by the bent portion 539. The roller 540 is in rolling contact with the positioning surfaces or cam surfaces 542 of the positioning plate 541.

The flat linking member 543 is provided so as to link together the supporting arms 536 and 536, and a second flat linking member 545 is provided so as to link together the arm portions 535 and 535. Inclination of the fist linking member 543 relative to the second linking member 545 can be changed with a structure similar to the fourth embodiment. Therefore, further description is negligible.

By rotating the adjustment bolt 538 about its axis, the bolt 538 is moved toward and away from the positioning surfaces 542. In this case, since the bent portion 539a of the control arm 539 is positioned between the end face of the bolt 538 and the positioning surfaces 542, and since the roller 540 rotatably positioned to the bent portion is in contact with one of the positioning surfaces 542, the arm portion 535 is angularly pivoted about an axis of the shaft 533 by the rotation of the adjustment screw 538. In other words, angular relationship between the control arm 539 and the pivot arm 537 is changed by the threading movement of the adjustment bolt 538. When the pivot arm 537 is pivotally moved, the vertical position of the roller 536a is also changed, so that the vertical position of the mirror unit 531 can be changed.

According to the fifth embodiment, even if the mirror unit supporting mechanism, i.e., the lever arm 535, 536 is pivotally moved about the axis of the shaft 533 by rotating the adjustment screw 538 so as to effect fine control to the vertical position of the mirror unit 531, relative position between the roller 540 and the positioning surface 542 can be maintained unchanged, since the roller 540 is rotatably connected to the pivotable control arm 539. Therefore, during this fine control, initially set copying magnification can be maintained. In the foregoing embodiments, the pivotal motion of such lever unit 530 is given by the vertical movement of the positioning surface 542. The same is true with respect to the fifth embodiment. However, the fifth embodiment can also perform additional pivotal motion of the lever unit 530 without any vertical movement of the positioning surface 542 in order to conduct fine position control of the mirror unit because of the provision of the additional control arm 539.

Figure 21:
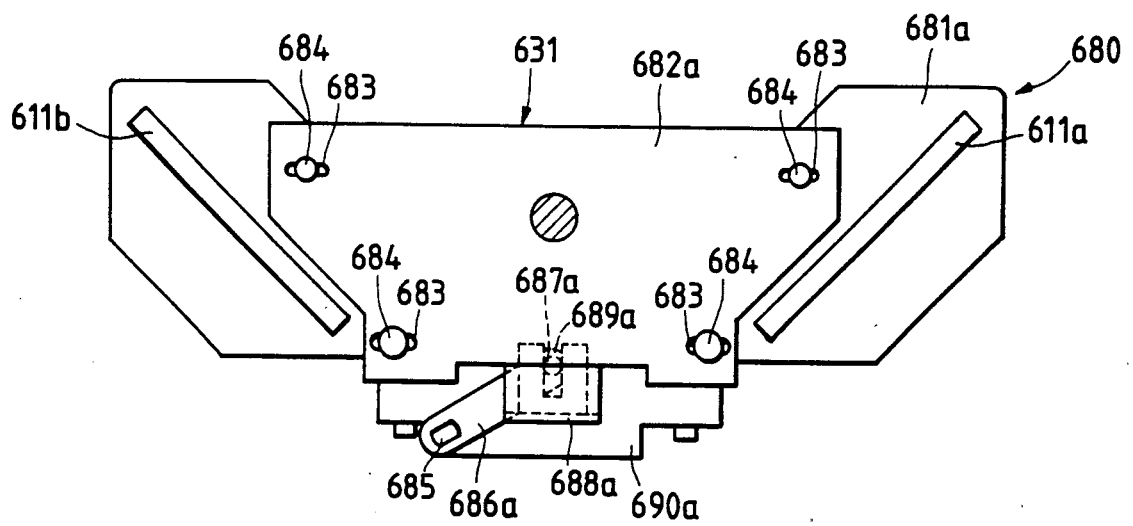
FIG. 21 is a side view showing a mirror unit having mirror position adjusting mechanism according to a sixth embodiment of this invention.

Next, a sixth embodiment according to the present invention will be described with reference to FIGS. 21 and 23. The sixth embodiment pertains to an improvement on the mirror unit for controlling a position of the mirror unit in a direction indicated by the arrow A (FIG. 1).

Figure 12:
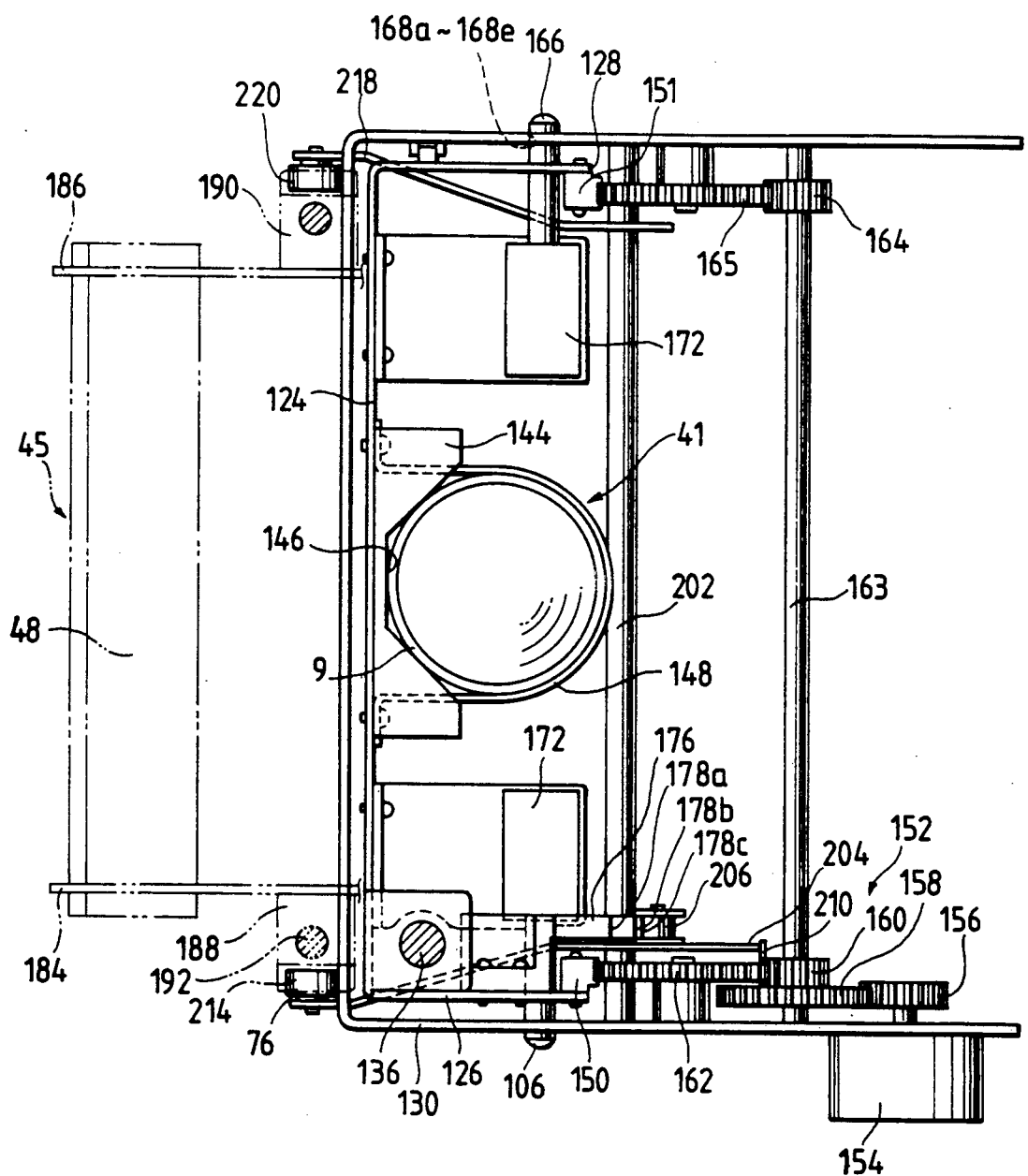
FIG. 12 is a plan view particularly showing a lens unit, a mirror unit and a lever stop member according to the third embodiment.

In the foregoing embodiment, the first and second mirrors are fixed by a mirror holder such as the first and second supporting plates (for example, the plates 184 and 186 in FIG. 3 and 12). On the other hand, in the sixth embodiment, a mirror holder 680 is supported by a holder attaching plate 631, and relative position between the mirror holder 680 and the holder attaching plate can be controlled.

Figure 22:
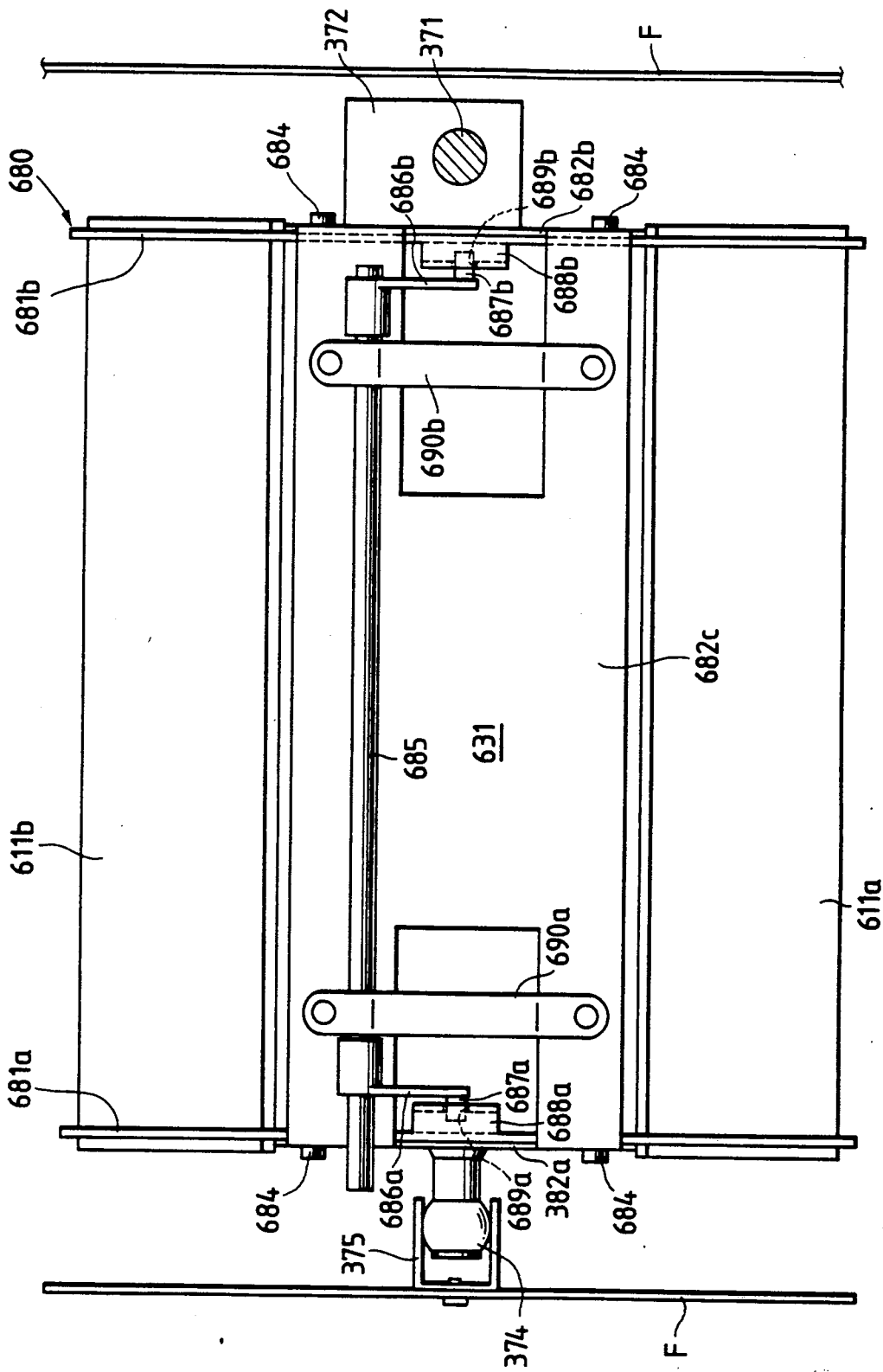
FIG. 22 is a is a bottom view of the mirror position adjusting mechanism in the mirror unit according to the sixth embodiment of this invention.

More specifically, first and second mirrors 611a 611b are fixedly supported by the first and second mirror supporting plates 681a,681b of the mirror holder 680 as shown in FIG. 22. The first and second mirrors 611a,611b spacedly provided and are directed in symmetrical relationship and define an intersection angle of 90 degrees. That is, the first mirror 611a is inclined to have an inclination angle of 45 degrees with respect to a horizontal line, and the second mirror 611b is inclined to have an inclination angle of 135 degrees. The holder attaching plate 631 has a U-shape having side walls 682a,682b and a bottom wall 682c.

Each of the side walls 682a,682b of the holder attaching plate 631 is formed with a plurality of slots 683, and corresponding screws 684 extend through the slots 683 so as to fix the mirror supporting plates 681a,681b of the mirror holder 680 to the holder attaching plate 631. These slots 683 extend in a direction perpendicular to the light path reaching the first mirror 611a. In this embodiment, the light incident angle with respect to the first mirror 611a is 45 degrees, and therefore, these slots 683 extend in horizontal direction. When unfastening these screws 684, the holder attaching plate 631 is movable in the horizontal direction along these slots.

The bottom plate 682c of the holder attaching plate 631 is provided with a pair of bearing members 690a,690b spaced away from each other and positioned adjacent the respective side walls 682a,682b of the attaching plate 631. A shaft 685 is fixedly connected to the pair of bearing members 690a,690b. Further, arm members 686a,686b are positioned outwardly of the bearing members 690a,690b. Each of the arm members 686a,686b has one end connected to the shaft 686, and has another end provided with a pin 687a,687b. Each of the mirror supporting plates 681a,681b of the mirror holder 680 has an inner surface provided with a suspension plate 688a,688b where a guiding groove 689a,689b is defined. Each of the pins 687a,687b of the arm members 686a,686b is in sliding engagement with each of the guiding grooves 689a,689b.

Figure 23:
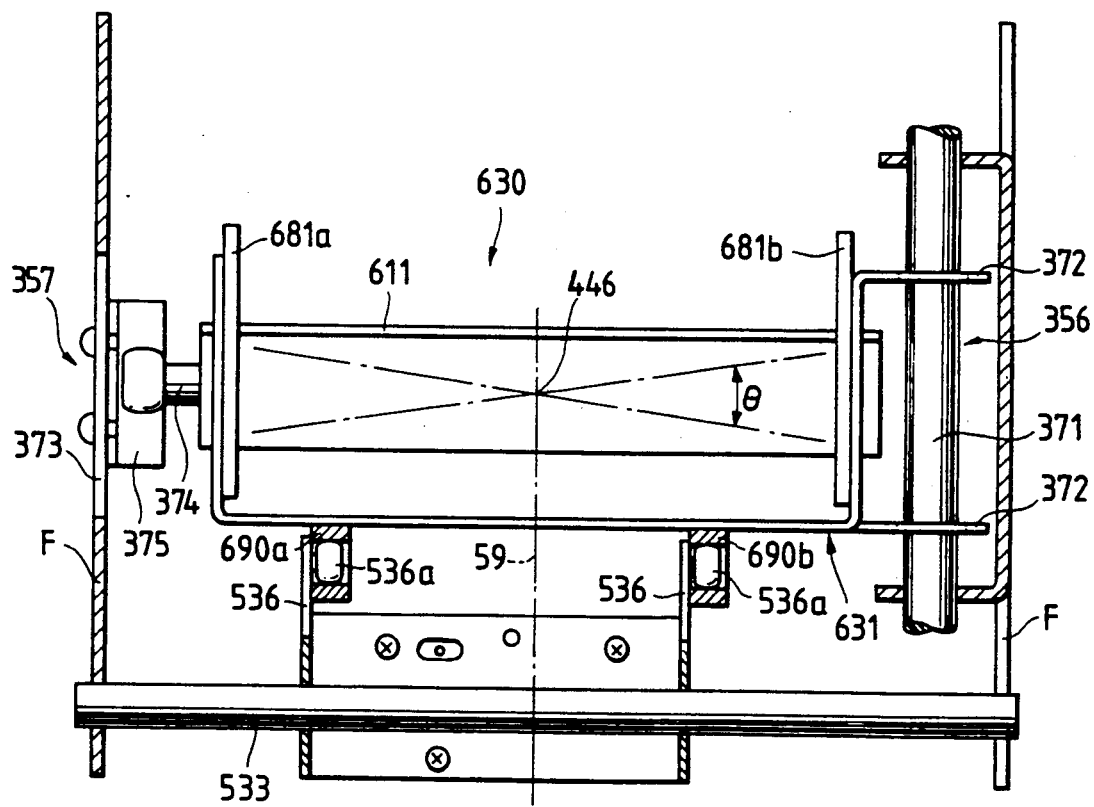
FIG. 23 is a rear view showing the mirror unit and the mirror position adjusting mechanisms according to the sixth embodiment of this invention.

The bearing members 690a, 690b are formed with horizontal slots as shown in FIG. 23, so that rollers 536a,536b are in rolling contact with these slots. Therefore, the vertical position of the mirror unit can be controlled in the manner similar to the foregoing embodiments.

After the screws 684 are unfastened, and the shaft 685 is rotated about its axis, the arm members 686a, 686b are pivotally moved, to thereby move the pins 687a,687b in an arcuate locus. In this case, since the pins 687a,687b are engaged with the guiding grooves 689a,689b, the pins are vertically slidingly urge the guiding groove 689a,689b in the horizontal direction. Consequently, the mirror supporting plates 681a,681b of the mirror unit 680 is moved in the same horizontal direction.

In the sixth embodiment, the mirror position, particularly the position of the first mirror 611a can be adjusted in the horizontal direction. Therefore, the light incident position on the first mirror 61a can be changed or controlled. Once the optimum or predetermined light incident position is obtained, the screws 684 are fastened. Accordingly, in the sixth embodiment, mirror position is easily controllable with a simplified construction.

While the invention has been described in detail and with reference to specific embodiments thereof, it would be apparent to those skilled in the art that various changes and modifications can be made therein without departing from the spirit and scope of the invention.

What is claimed is:

1. An image recording apparatus including a stationary frame, a light source for irradiating light onto an original, the light from the original containing an imaging information corresponding to an image of the original, and an exposure zone on which an image recording medium is disposable for forming an image thereon; the image recording apparatus comprising:

a lens unit having a lens through which the light from the original passes, the lens unit being movably guided by the stationary frame;

a mirror unit for reflecting the light from the lens unit and directing the light toward the image recording medium, the mirror unit being movably guided by the stationary frame;

a first movable means movable together with one of the lens unit and the mirror unit, the first movable means defining a plurality of copying magnifications;

a second movable means movable in response to a movement of the first movable means, the second movable means being abuttable on the first movable means and on a remaining one of the mirror unit and the lens unit;

a first moving unit for moving one of the lens unit and the mirror unit in order to provide a copying magnification among the plurality of copying magnifications, the movement of the second movable means responsive to the movement of the first movable means moving the remaining one of the mirror unit and the lens unit to one of positions corresponding to the copying magnification; and a second moving unit for selectively moving the second movable means.

2. The image recording apparatus as claimed in claim 1, wherein the second moving unit moves the second movable means in a direction away from the first movable means prior to the movement of one of the lens unit and the mirror unit by the first moving unit, and for moving the second movable means toward the first movable means after the movement of one of the lens unit and the mirror unit is terminated.

3. The image recording apparatus as claimed in claim 2, wherein the first movable means is provided at the lens unit, and the first moving unit moves the lens unit, and wherein the second movable means has one end abuttable on the first movable means and has another end abuttable on the mirror unit.

4. The image recording apparatus as claimed in claim 3, wherein the first movable means comprises a cam plate having a plurality of cam surfaces, the numbers of the cam surfaces corresponding to the plurality of copying magnifications, and protruding amounts of the cam surface corresponding to moving amounts of the mirror unit.

5. The image recording apparatus as claimed in claim 3, wherein the second movable means is pivotally supported by the stationary frame.

6. The image recording apparatus as claimed in claim 5, wherein the second moving unit moves the second movable means in a direction away from the can surfaces prior to the movement of the lens unit by the first moving unit, and for moving the second movable means toward the cam surfaces after the movement of the lens unit is terminated.

7. The image recording apparatus as claimed in claim 6, wherein the second movable means comprises a shaft extending between the stationary frame; at least one L-shaped lever member mounted on the shaft, the L-shaped lever member having a first arm and a second arm, a free end of the first arm supporting the mirror unit and a free end of the second arm being abuttable on the cam surfaces.

8. An image recording apparatus including a stationary frame, a light source for irradiating light onto an original, the light from the original containing an imaging information corresponding to an image of the original, and an exposure zone on which an image recording medium is disposable for forming an image thereon; the image recording apparatus comprising:

a lens unit having a lens through which the light from the original passes, the lens unit being movably guided by the stationary frame;

a mirror unit for reflecting the light from the lens unit and directing the light toward the image recording medium, the mirror unit being movably guided by the stationary frame;

a first movable means movable together with one of the lens unit and the mirror unit, the first movable means defining a plurality of copying magnifications, wherein the first movable means comprises a cam plate having a plurality of cam surfaces, protrusion amounts on the plurality of cam surfaces being different from each other for providing a largest protruding cam surface;

a second movable means in response to a movement of the first movable means, the second movable means being abuttable on the first movable means and on a remaining one of the mirror unit and the lens unit;

a first moving unit for moving one of the lens unit and the mirror unit in order to provide a copying magnification among the plurality of copying magnifications, the movement of the second movable means responsive to the movement of the first movable means moving the remaining one of the mirror unit and the lens unit to one of positions corresponding to the copying magnification; and a stop means for preventing the second movable means from being separated from the largest protruding cam surface.

9. The image recording apparatus as claimed in claim 8, wherein the largest protruding cam surface defines an equimagnification of copying.

10. An image recording apparatus including a stationary frame, a light source for irradiating light onto an original, the light from the original containing an imaging information corresponding to an image of the original, and an exposure zone on which an image recording medium is disposable for forming an image thereon; the image recording apparatus comprising:

a lens unit having a lens through which the light from the original passes, the lens unit being movably guided by the stationary frame;

a mirror unit for reflecting the light from the lens unit and directing the light toward the image recording medium, the mirror unit being movably guided by the stationary frame;

a first movable means movable together with one of the lens unit and the mirror unit, the first movable means defining a plurality of copying magnifications;

a second movable means movable in response to a movement of the first movable means, the second movable means being abuttable on the first movable means and on a remaining one of the mirror unit and the lens unit, wherein the second movable means comprises:

a shaft rotatably supported by the stationary frame;

a pair of first arm portions mounted on the shaft and positioned spaced away from each other in a widthwise direction of the mirror unit, the first arm portions having first ends abuttable on the first movable means and another ends;

a first linking member connecting between the another ends of the first arm portions;

a pair of second arm portions having first ends supporting the mirror unit and having another ends; and a second linking member connecting between the another ends of the second arm portions, the second linking member being engageable with the first linking member, and being pivotally movable about a widthwise center of the mirror unit with respect to the first linking member, whereby inclination of the mirror unit is controllable; and a first moving unit for moving one of the lens unit and the mirror unit in order to provide a copying magnification among the plurality of copying magnifications, the movement of the second movable means responsive to the movement of the first movable means moving the remaining one of the mirror unit and the lens unit to one of positions corresponding to the copying magnification.

11. The image recording apparatus as claimed in claim 10, wherein the second movable means further comprises a pair of rollers rotatably supported by the one ends of the second arm portions, the pair of rollers being in rolling contact with the mirror unit for supporting the mirror unit.

12. The image recording apparatus as claimed in claim 11, wherein the rollers comprises barrel rollers having arcuate outer peripheral surfaces, so as to provide two point contact with the mirror unit.

13. The image recording apparatus as claimed in claim 12, wherein the mirror unit comprises a bottom plate, and a pair of suspension plates suspended from the bottom plate, the suspension plates being formed with elongated slots in which the barrel rollers are positioned.

14. The image recording apparatus as claimed in claim 10, wherein the second movable means further comprises means for adjusting pivotal position of the first arm portion, the adjusting means comprising a control lever rotatably mounted on the shaft, the control lever having a free end in direct abutment with the first movable means, an adjustment screw provided at the one end of the first arm portion, the adjustment screw being abuttable on the free end, adjustment of the adjustment screw causing the pivotal movement of the first arm portion so as to pivotally move the second arm portion while abutting relation between the free end of the control lever and the first movable means is maintained unchanged.

15. The image recording apparatus as claimed in claim 1, wherein the mirror unit comprises a first mirror on which the light from the lens unit is applied, and a second mirror, the light reaching to the first mirror being reflected and directed toward the second mirror in a light reflection path, a mirror holder for supporting the first and the second mirrors, and a holder attaching means for attaching the mirror holder, a position of the mirror holder relative to the holder attaching means being controlled in a direction parallel with the light reflection path.

16. An image recording apparatus including a light source, an original supporting means, and an exposure zone on which an image recording medium is exposed to light, an optical path being provided from the light source to the exposure zone; the image recording apparatus comprising:

a drive source;

a lens unit connected to the drive source and linearly movable along the optical path;

a linking means pivotally supported and having one end in confrontation with the lens unit and another end;

a cam means provided at one of the lens unit and the linking means;

a contact means provided at remaining one of the linking means and the lens unit; the contact means being abuttable on the cam means;

a mirror unit supported by the another end of the linking means and linearly movable along the optical path in response to the linear movement of the lens unit; and means for preventing pivotal motion of the linking means for preventing the cam means and the contact means from being separated from each other.

17. An image recording apparatus including a frame and an exposure stand on which an image recording medium is exposed to light, the apparatus comprising:

a lens unit;

a mirror unit movably disposed between the lens unit and the exposure stand;

a mirror unit supporting mechanism for changing an controlling a position of the mirror unit; the mirror unit supporting mechanism comprising;

a shaft rotatably supported by the frame and extending in a widthwise direction of the mirror unit;

a pair of first arm portions spaced away from each other and mounted on the shaft, the first arm portions having base ends and free ens;

a first linking member connected between the base ends and extending in the widthwise direction of the mirror unit;

a pair of second arm portions spaced away from each other and having free ends and base ends, the free ends of the second arm portions supporting the mirror unit;

a second linking member connected between the base ends of the second arm portions, the second linking member being positioned in confrontation with the first linking member; and means for coupling the first and second linking members, the coupling means being provided with position adjusting means for pivotal moving the second linking member relative to the first linking member about a widthwise center axis of the mirror unit, whereby vertical positions of the free ends of the second arm portions can become different from each other.

18. The image recording apparatus as claimed in claim 17, further comprising a pair of rollers each rotatably supported by each of the free ends of the second arm portions, the pair of rollers being in rolling contact with the mirror unit.

19. The image recording apparatus as claimed in claim 17, further comprising a cam means having a plurality of cam surfaces, the free ends of the first arm portions being abuttable on the cam surfaces for pivotally moving the second arm portions about the shaft whereby vertical position of the mirror unit can be changed.

20. The image recording apparatus as claimed in claim 19 further comprising a pair of rollers each rotatably supported by each of the free ends of the second arm portions, the pair of rollers being in rolling contact with the mirror unit.

21. The image recording apparatus as claimed in claim 19 further comprising an control arm having a base end rotatably mounted on the shaft and a free end in abutment with the cam surfaces, adjusting member provided between at one of the free ends of the first arm portions and the free end of the control arm.

22. An image recording apparatus including a light source, an exposure stand, and a mirror unit disposed between the light source and the exposure stand, the light source providing an optical path reaching the exposure stand through the mirror unit, the apparatus comprising:

the mirror unit comprising;

a first mirror and a second mirror positioned spaced away from the first mirror, the first and the second mirror being confrontingly arrayed to provide a V shape, a light from the light source being first applied to the first mirror and then directed to the second mirror in a second optical path; a mirror holder for holding the first and the second mirror in the V shape array;

a holder supporting means which supports the mirror holder, wherein the holder supporting means comprises a U-shaped member having side walls and a bottom wall, each of the side walls being formed with a plurality of slots extending in the direction of the second optical path, and an equal plurality of screws extending through the slots and threadingly engaged with the mirror holder; and a mirror position adjusting means provided between the holder supporting means and the mirror holder for moving mirror holding in a direction parallel with the second optical path.

23. The image recording apparatus as claimed in claim 22, further comprising a lens unit and means for moving the mirror unit, the moving means being connected to the mirror holder, and being movable in response to a movement of the lens unit.

24. The image recording apparatus as claimed in claim 22, wherein the mirror holder is provided with a guide means, and wherein the mirror position adjusting means comprises a rotatable shaft rotatable about its axis, at least one arm member having one end fixedly connected to the rotatable shaft and another end provided with a pin engageable with the guide means, rotation of the shaft pivoting the arm to slidingly move the pin relative to the guide means, to thereby urge the guide means in the second direction within a range of a length of the slots.

25. The image recording apparatus as claimed in claim 24, further comprising bearing members provided at the bottom wall of the holder supporting means for rotatably supporting the shaft.

26. The image recording apparatus as claimed in claim 25, further comprising a lens unit and means for moving the mirror unit, the moving means being connected to the mirror holder, and being movable in response to a movement of the lens unit.

* * * * *